US012733236B2

(12) United States Patent
Sanda

(10) Patent No.: US 12,733,236 B2
(45) Date of Patent: Sep. 8, 2026

(54) SEMICONDUCTOR DEVICE

(71) Applicant: ROHM CO., LTD., Kyoto (JP)

(72) Inventor: Shoya Sanda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 411 days.

(21) Appl. No.: 18/470,462

(22) Filed: Sep. 20, 2023

(65) Prior Publication Data

US 2024/0014275 A1 Jan. 11, 2024

Related U.S. Application Data

(63) Continuation of application No. PCT/JP2022/004481, filed on Feb. 4, 2022.

(30) Foreign Application Priority Data

Mar. 22, 2021 (JP) ................................ 2021-047913

(51) Int. Cl.
*H10D 64/00* (2025.01)
*H10D 64/27* (2025.01)

(52) U.S. Cl.
CPC ......... *H10D 64/112* (2025.01); *H10D 64/117* (2025.01); *H10D 64/513* (2025.01); *H10D 64/519* (2025.01)

(58) Field of Classification Search
CPC .. H10D 30/668; H10D 64/117; H10D 64/519; H10D 64/112; H10D 64/513; H10D 30/665; H10D 62/127; H10D 30/0297; H10D 64/258; H10D 64/517; H10D 64/252; H10D 64/511; H10D 30/0295; H10D 62/111; H10D 84/141; H10D 84/811; H10D 64/256; H10D 64/01; H10D 62/102; H10D 64/281; H10D 12/481; H10D 12/038; H01L 29/41741; H01L 29/4236; H01L 29/407; H01L 29/0696; H01L 2224/0603;
(Continued)

(56) References Cited

U.S. PATENT DOCUMENTS 9,842,920 B1 * 12/2017 Jeon .................... H10D 64/258
10,103,257 B1 * 10/2018 Qin ..................... H10D 64/117
(Continued)

FOREIGN PATENT DOCUMENTS

JP 2020-202313 A 12/2020

OTHER PUBLICATIONS

International Search Report and Written Opinion mailed on Apr. 26, 2022, received for PCT Application PCT/JP2022/004481, filed on Feb. 4, 2022, 9 pages including English Translation.

*Primary Examiner* — Mouloucoulaye Inoussa
(74) *Attorney, Agent, or Firm* — XSENSUS LLP

(57) ABSTRACT

This semiconductor device includes a plurality of sets of gate trenches, a plurality of gate electrodes, a plurality of field plate electrodes, a gate wiring, and a source wiring. The plurality of field plate electrodes each include two terminals connected to the source wiring. An outer peripheral gate wiring part of the gate wiring includes a gate finger that extends along a first direction in a plan view, and an inner gate wiring part includes a gate finger that extends along a second direction in a plan view. A first set of gate trenches extend along the first direction in a plan view and cross the gate finger, and a second set of gate trenches extend in the second direction in a plan view and cross the gate finger.

15 Claims, 7 Drawing Sheets

(58) Field of Classification Search
CPC . H01L 2224/06181; H01L 2224/29101; H01L 2224/32225; H01L 2224/48091; H01L 2224/48227; H01L 2224/73265; H01L 2224/83801; H01L 2924/00014; H01L 2924/13091; H02M 1/34; H02M 1/348; H02M 7/003
See application file for complete search history.

(56) References Cited

U.S. PATENT DOCUMENTS 11,646,369 B2 * 5/2023 Nagahisa ............. H10D 84/038 363/132
2005/0224848 A1 * 10/2005 Kurosaki ............. H10D 12/038 257/E21.384
2006/0157779 A1 * 7/2006 Kachi .................. H10D 30/665 257/E29.136
2010/0123220 A1 * 5/2010 Burke .................. H10D 30/668 257/E21.294
2010/0140689 A1 * 6/2010 Yedinak ............... H10D 62/126 257/330
2010/0140695 A1 * 6/2010 Yedinak ................. H10D 8/605 257/334
2010/0140697 A1 * 6/2010 Yedinak ............... H10D 30/668 257/334
2012/0205669 A1 * 8/2012 Miura ................ H10D 30/0291 257/77
2013/0020587 A1 * 1/2013 Hino .................... H10D 62/393 257/77
2013/0026485 A1 * 1/2013 Hur ........................ H10D 64/23 257/E29.089
2013/0026494 A1 * 1/2013 Oritsuki ............... H10D 30/665 257/77
2013/0168700 A1 * 7/2013 Furukawa .......... H10D 62/8325 257/77
2014/0225114 A1 * 8/2014 Furukawa ............... H01L 23/60 257/48
2015/0288357 A1 * 10/2015 Hirose ................. H03K 17/567 257/773
2016/0020310 A1 * 1/2016 Shiga ................... H10D 12/481 438/18
2016/0027906 A1 * 1/2016 Onozawa ............. H10D 62/127 257/144
2016/0064556 A1 * 3/2016 Qin ...................... H10D 64/519 257/334
2016/0079411 A1 * 3/2016 Hino .................... H10D 30/669 257/77
2016/0197176 A1 * 7/2016 Stefanov .............. H10D 62/158 257/334
2016/0240614 A1 * 8/2016 Okuhata .............. H10D 62/111
2016/0247916 A1 * 8/2016 Stefanov .............. H10D 30/645
2016/0284838 A1 * 9/2016 Qin ...................... H10D 62/153
2016/0379992 A1 * 12/2016 Nagao .................. H10D 84/907 257/77
2017/0025404 A1 * 1/2017 Padmanabhan ...... H10D 64/257
2017/0062574 A1 * 3/2017 Nagata ................. H10D 64/118
2018/0183433 A1 * 6/2018 Ojima .................. H10D 64/519
2019/0081173 A1 * 3/2019 Nishiwaki ............ H10D 62/105
2019/0097043 A1 * 3/2019 Tominaga ............ H10D 64/517
2019/0131443 A1 * 5/2019 Hoshi .................. H10D 64/519
2019/0198660 A1 * 6/2019 Kachi .................. H10D 62/106
2019/0245078 A1 * 8/2019 Yedinak ............... H10D 64/112
2019/0280117 A1 * 9/2019 Mirchandani ........ H10D 64/519
2019/0288082 A1 * 9/2019 Sagawa .............. H10D 62/8325
2019/0371935 A1 * 12/2019 Hatta ................... H10D 84/038
2020/0258977 A1 * 8/2020 Nakano ................ H10D 30/025
2020/0273858 A1 * 8/2020 Nasu ...................... H10D 84/83
2020/0295182 A1 * 9/2020 Hoshi ................ H10D 62/8325
2020/0357917 A1 * 11/2020 Zundel ................. H10D 64/252
2021/0043741 A1 * 2/2021 Hu ....................... H10D 64/117
2021/0057573 A1 * 2/2021 Shimomura ....... H10D 84/0135
2021/0249535 A1 * 8/2021 Nagata ................. H10D 64/514
2021/0265497 A1 * 8/2021 Zundel ................ H01L 29/0696
2021/0367071 A1 * 11/2021 Shinoda ............... H10D 30/668
2022/0013664 A1 * 1/2022 Ohtani ................. H10D 30/668
2022/0037523 A1 * 2/2022 Oda ..................... H10D 64/232
2022/0059649 A1 * 2/2022 Zaima .................. H10D 64/231
2022/0278133 A1 * 9/2022 Nagao .................. H10D 84/141
2023/0085094 A1 * 3/2023 Hatada ................. H10D 62/127 257/330
2023/0143787 A1 * 5/2023 Nishimura ........... H10D 62/127 257/470
2023/0197845 A1 * 6/2023 Takizawa ............. H10D 62/152 257/330

* cited by examiner 10
12C
60B
58A1
12
S2
52
50
64
66
S1
F2
S1
58B1
F3
F3
F2
12D
12F
S2
58B2
60A
S2
58
S1_1
S1_2
S1_3
S1
S1_4
S1_5
S1_6
S1
60
56(14)
54(14)
16
Y
Z
X
12E
S2_1
S2_2
S2_3
S2_4
S2
62
58A2

10
50
16
48
20B
S1_n
44
26
46
24
38 (34)
20
14
20A
30
42 (34)
22
18
40 (34)
32
34
12B
12
12A
28
Z
X
Y 10
66(50)
16
18B
14
34
12
28
68
72
60B
(52)
70
66 (50)
18
20
18A
S1_n
58B2
(52)
X
Z
Y
64(50)

S2
S2_1
S2_3
S2_5
S2_7
S2_9
S2_11
S2_2
S2_4
S2_6
S2_8
S2_10
106A1
12C
100
12
102
104
112
114
106B2
12F
12D
106B1
108B
S1_1
S1_2
S1_3
S1_4
S1_5
S1_6
S1_7
S1_8
S1
S1
S1
108
110
56(14)
54(14)
16
Y
Z
X
106A2
12E
106

200
S2
S2_1 S2_2 S2_3 S2_4
206A1
206A3
12C
12
S2
202
204
212
214
206B2
12D
12F
208A
206B1
S2
S2
208B
S1_1
S1_2
S1_3
S1_4
S1_5
S1_6
S1
S1
S1
208
210
56(14)
54(14)
16
206A2
12E
206
Y
Z
X

300
S2
S2_1 S2_2 S2_3 S2_4
12C
308B
306A1
12
302
S1
S1
306B1
12D
304
312
314
S2
308A2
S2
12F
S1_1
S1_2
S1_3
S1_4
S1
306B2
S1
S2
308A1
S2
306
S1
S1
308
56(14)
54(14)
S2
16
Y
Z
X
306A2
310
12E 400
60B
12C
404
58A1
12
S2
52
50
64
66
S1
S1
58B1
404
404
402
402
402
402
12D
12F
S2
404
58B2
60A
404
S2
402
402
402
402
58
404
404
S1
S1
60
56(14)
54(14)
404
S2
16
Y
Z
X
12E
62
58A2

SEMICONDUCTOR DEVICE

CROSS-REFERENCE TO RELATED APPLICATIONS

This application is a continuation of International Application No. PCT/JP2022/004481, filed Feb. 4, 2022, which claims priority to JP 2021-047913, filed Mar. 22, 2021, the entire contents of each are incorporated herein by reference.

BACKGROUND

1. Field

The present disclosure relates to a semiconductor device.

2. Description of Related Art

Japanese Laid-Open Patent Publication No. 2020-202313 discloses semiconductor device including a metal insulator semiconductor field effect transistor (MISFET) having a trench gate structure. In the semiconductor device of Patent Literature 1, a gate electrode is embedded in each gate trench of a plurality of gate trenches and electrically connected to a gate interconnection (gate finger) via a gate contact.

DETAILED DESCRIPTION

Several embodiments of a semiconductor device in accordance with the present disclosure will now be described with reference to the accompanying drawings. Elements in the figures are illustrated for simplicity and clarity and have not necessarily been drawn to scale. To facilitate understanding, hatching lines may not be shown in the cross-sectional drawings. The accompanying drawings illustrate exemplary embodiments in accordance with the present disclosure and are not intended to limit the present disclosure.

This detailed description provides a comprehensive understanding of the methods, apparatuses, and/or systems described. Exemplary embodiments may have different forms, and are not limited to the examples described.

Figure 1:
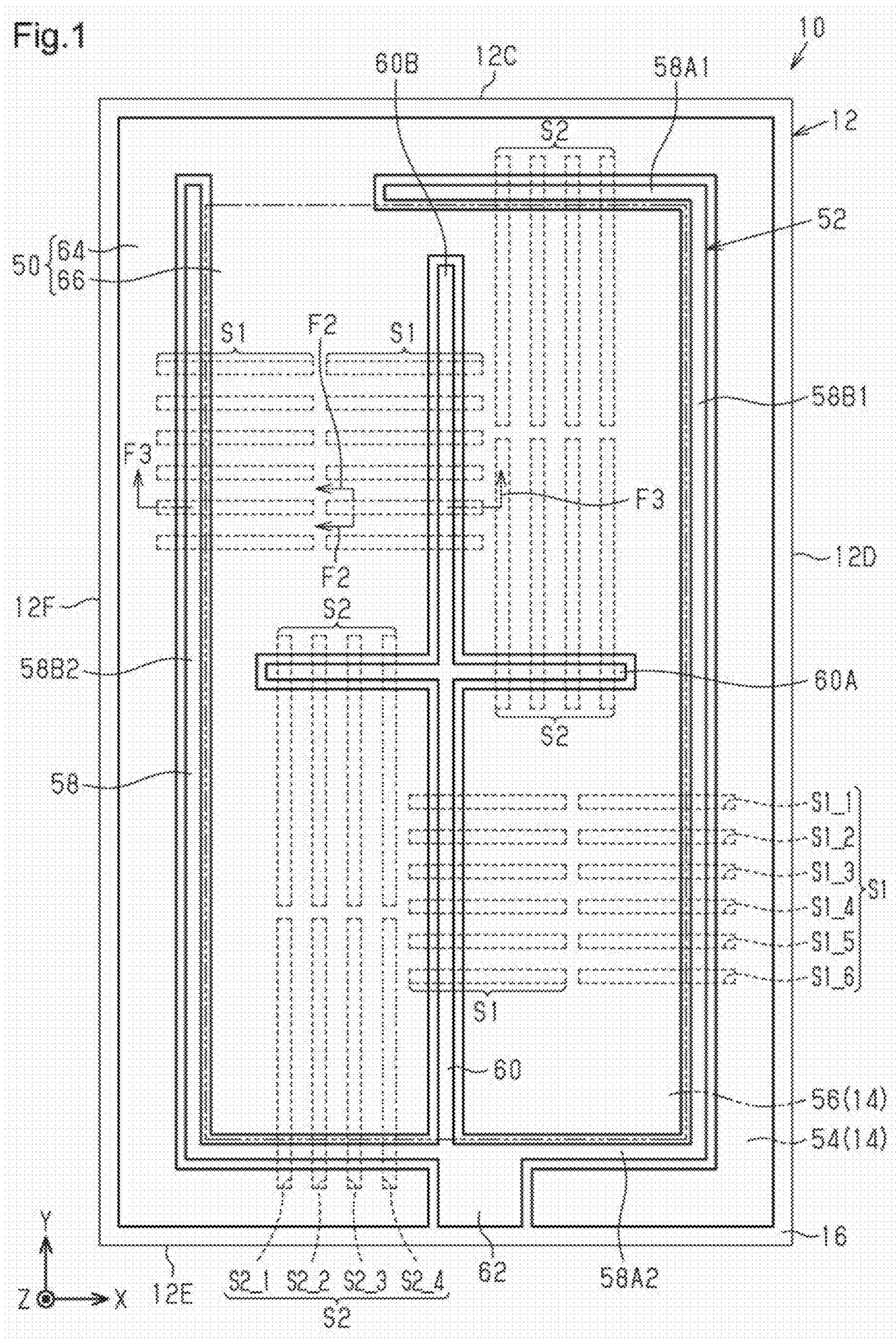
FIG. 1 is a schematic plan view exemplifying one embodiment of a semiconductor device.

FIG. 1 is a schematic plan view exemplifying one embodiment of a semiconductor device 10. In this specification, the X-axis, Y-axis, and Z-axis are orthogonal to one another as shown in FIG. 1. The term “plan view” as used in this specification is a view of the semiconductor device 10 taken in the Z-direction.

The semiconductor device 10 is, for example, a MISFET having a trench gate structure. The semiconductor device 10 includes a semiconductor substrate 12, a semiconductor layer 14 formed on the semiconductor substrate 12, plural sets of gate trenches S1 and S2 formed in the semiconductor layer 14, and an insulation layer 16 formed on the semiconductor layer 14. In the present embodiment, the semiconductor substrate 12 may be a Si substrate. The semiconductor substrate 12 includes a bottom surface 12A and an upper surface 12B at the side opposite the bottom surface 12A, as will be described later with reference to FIG. 2. In FIG. 1, the Z-direction is perpendicular to the bottom surface 12A and the upper surface 12B of the semiconductor substrate 12.

In the example of FIG. 1, the upper surface 12B of the semiconductor substrate 12 includes two sides (first sides) 12C and 12E extending in the X-direction and two sides (second sides) 12D and 12F extending in the Y-direction. The upper surface 12B of the semiconductor substrate 12 is covered by the semiconductor layer 14 and the insulation layer 16. Thus, FIG. 1 shows only the periphery of the rectangular semiconductor substrate 12 (i.e., four sides 12C, 12D, 12E, 12F). The region defined by the periphery of the semiconductor substrate 12 shown in FIG. 1 may correspond to a single chip (die). In the present disclosure, the X-direction may be referred to as the first direction, and the Y-direction may be referred to as the second direction. In the example of FIG. 1, the sides 12C and 12E extending in the X-direction are shorter than the sides 12D and 12F extending in the Y-direction. The sides 12D and 12F extending in the Y-direction have the same length and are longer than the sides 12C and 12E extending in the X-direction. The lateral direction and the longitudinal direction of the upper surface 12B of the semiconductor substrate 12 respectively correspond to the X-direction and the Y-direction. In another example, the sides 12C and 12E may have the same length as the sides 12D and 12F or have a greater length than the sides 12D and 12F.

The semiconductor layer 14 may be formed by a Si epitaxial layer. The semiconductor layer 14 has the same shape as the semiconductor substrate 12 in plan view. The semiconductor layer 14 will be described in detail later with reference to FIG. 2.

The insulation layer 16 may include at least one of a silicon oxide ($SiO_2$) layer and a silicon nitride (SiN) layer. The insulation layer 16 is also referred to as an inter-layer dielectric (ILD).

The plural sets of gate trenches S1 and S2 are shown by broken lines in FIG. 1. Each of the plural sets of gate trenches S1 and S2 include gate trenches arranged parallel to one another at equal intervals. The plural sets of the gate trenches S1 and S2 include first sets of the gate trenches S1 and second sets of the gate trenches S2. The gate trench S1_*n* in each first set extends in the X-direction in plan view. The gate trench S2_*n* in each second set extends in the Y-direction.

In the example of FIG. 1, each first set of the gate trenches S1 includes six gate trenches S1_1 to S1_6 that are arranged parallel to each other at equal intervals, and each second set of the gate trenches S2 includes four gate trenches S2_1 to S2_4 that are arranged parallel to each other at equal intervals. The plural sets of the gate trenches S1 and S2 include four first sets of the gate trenches S1 and four second sets of the gate trenches S2. In this manner, the gate trenches included in each first set may be greater in number than the gate trenches included in each second set. The number of gate trench sets and the number of gate trenches included in each set may be determined in order to allow for mounting of the semiconductor device 10 in accordance with the present disclosure.

Figure 2:
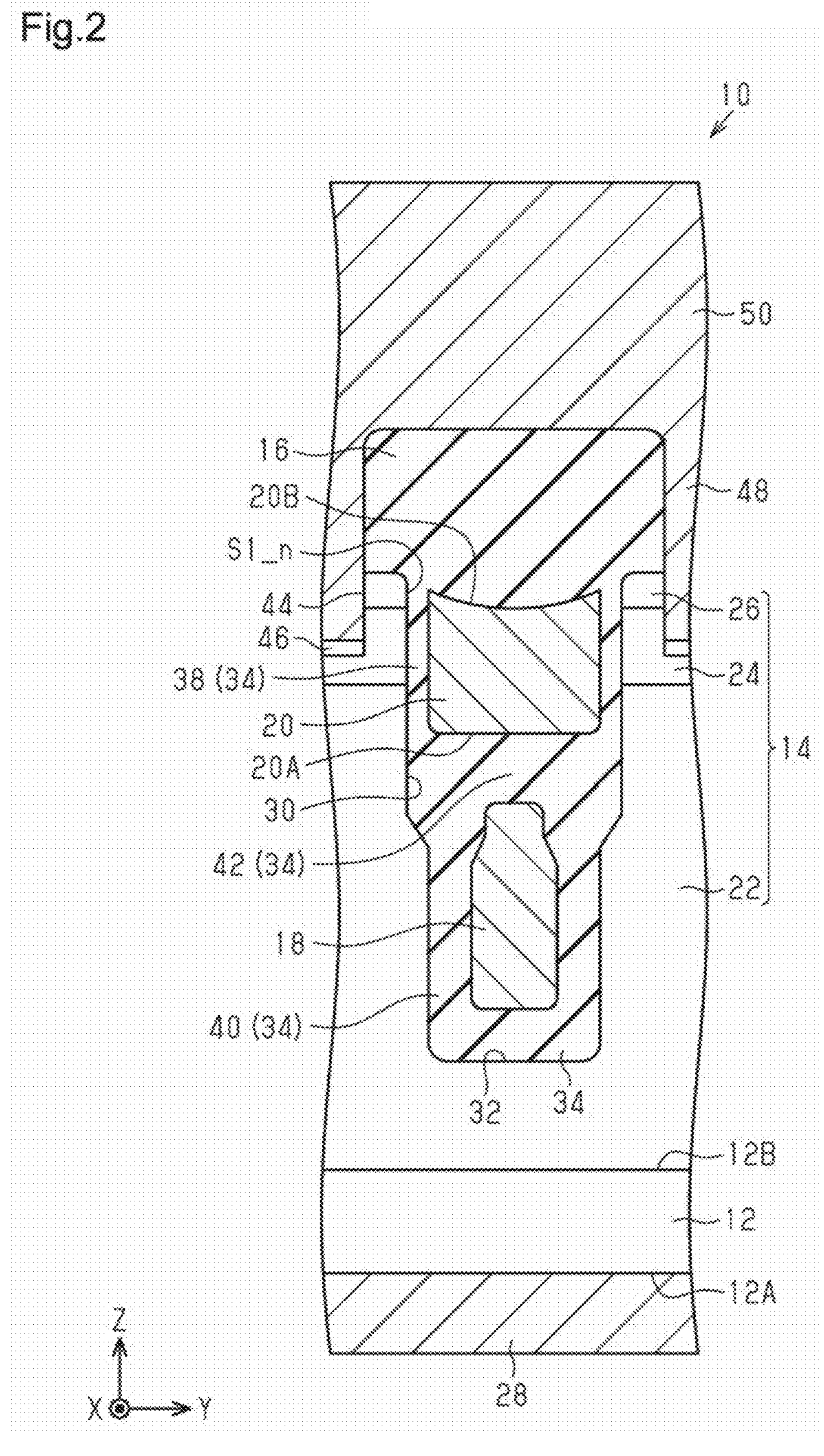
FIG. 2 is a schematic cross-sectional view of the semiconductor device taken along line F2-F2 in FIG. 1.

A field plate electrode 18 and a gate electrode 20, which will be described below with reference to FIG. 2, are embedded in each of the gate trenches S1_*n* and S2_*n* in the plural sets of the gate trenches S1 and S2.

FIG. 2 is a cross-sectional view of the semiconductor device 10 taken along line F2-F2 in FIG. 1. The drawing shows the cross section of one of the gate trenches S1_*n* in a first set of the gate trenches S1 taken along a YZ plane. Each gate trench S2_*n* in the second sets of the gate trenches S2 has a cross section taken along an XZ plane that is similar to that of FIG. 2. The structure related to one gate trench S1_*n* among the gate trenches S1 of the first set will be described below. Each gate trench in the plural sets of the gate trenches S1 and S2 may have a similar structure.

The semiconductor substrate 12 corresponds to a drain region of a MISFET. The semiconductor layer 14 includes a drift region 22 formed on the semiconductor substrate (drain region) 12, a body region 24 formed on the drift region 22, and a source region 26 formed on the body region 24.

The drain region formed by the semiconductor substrate 12 is an n-type region containing an n-type impurity. The semiconductor substrate 12 may have an n-type impurity concentration in a range from $1\times10^{18}$ $cm^{-3}$ to $1\times10^{20}$ $cm^{-3}$, inclusive. The semiconductor substrate 12 may have a thickness in a range from 50 m to 450 m, inclusive.

The drift region 22 is an n-type region containing an n-type impurity at a lower concentration than that of the semiconductor substrate (drain region) 12. The n-type impurity region of the drift region 22 may have an n-type impurity concentration in a range from $1\times10^{15}$ $cm^{-3}$ to $1\times10^{18}$ $cm^{-3}$, inclusive. The drift region 22 may have a thickness in a range from 1 m to 25 m, inclusive.

The body region 24 is a p-type region including a p-type impurity. The body region 24 may have a p-type impurity concentration in a range from $1\times10^{16}$ $cm^{-3}$ to $1\times10^{18}$ $cm^{-3}$, inclusive. The body region 24 may have a thickness in a range from 0.5 m to 1.5 m, inclusive.

The source region 26 is an n-type region containing an n-type impurity at a higher concentration than that of the drift region 22. The source region 26 may have an n-type impurity concentration in a range from $1\times10^{19}$ $cm^{-3}$ to $1\times10^{21}$ $cm^{-3}$, inclusive. The source region 26 may have a thickness in a range from 0.1 m to 1 m, inclusive.

In the present disclosure, n-type is referred to as a first conductive type and p-type is referred to as a second conductive type. The n-type impurity may be, for example, phosphorus (P), arsenic (As), or the like. The p-type impurity may be, for example, boron (B), aluminum (Al), or the like.

The semiconductor device 10 may further include a drain electrode 28 formed on the bottom surface 12A of the semiconductor substrate 12. The drain electrode 28 is electrically connected to the semiconductor substrate (drain region) 12. The drain electrode 28 may be formed from at least one of titanium (Ti), nickel (Ni), gold (Au), silver (Ag), copper (Cu), Al, a Cu alloy, and an Al alloy.

The gate trench S1_*n* is one of the gate trenches S1 in one of the plural sets of the gate trenches S1 and is formed in the semiconductor layer 14. The gate trench S1_*n* includes a side wall 30 and a bottom wall 32. The gate trench S1_*n* extends through the source region 26 and the body region 24 of the semiconductor layer 14 to the drift region 22. Thus, the bottom wall 32 of the gate trench S1_*n* is adjacent to the drift region 22. The gate trench S1_*n* may have a depth in a range from 1 m to 15 m, inclusive.

The field plate electrode 18 and the gate electrode 20 are formed in the gate trench S1_*n*. The field plate electrode 18 and the gate electrode 20 are separated from each other by a trench insulation layer 34. The trench insulation layer 34 covers the side wall 30 and the bottom wall 32 of the gate trench S1_*n*. The gate electrode 20 is located upward from the field plate electrode 18 in the gate trench S1_*n*. Such a structure that embeds two separated electrodes in a gate trench may be referred to as a split-gate structure.

The field plate electrode 18 is located in the gate trench S1_*n* between the bottom wall 32 of the gate trench S1_*n* and a bottom surface 20A of the gate electrode 20. The field plate electrode 18 is surrounded by the trench insulation layer 34. Source voltage is applied to the field plate electrode 18 to reduce electric field concentration in the gate trench S1_*n* and increase the breakdown voltage of the semiconductor device 10. Accordingly, the potential at the field plate electrode 18 will be the same as that at the source region 26.

The bottom surface 20A of the gate electrode 20 at least partially faces the field plate electrode 18. The gate electrode 20 also includes an upper surface 20B at a side opposite to the bottom surface 20A. The upper surface 20B of the gate electrode 20 may be located downward from the semiconductor layer 14.

In one example, the field plate electrode 18 and the gate electrode 20 are formed from polysilicon that is conductive.

The trench insulation layer 34 includes a gate insulation portion 38 that covers the side wall 30 of the gate trench S1_*n* between the gate electrode 20 and the semiconductor layer 14. The gate electrode 20 and the semiconductor layer 14 are separated by the gate insulation portion 38 in the Y-direction. A predetermined voltage is applied to the gate electrode 20 to form a channel in the p-type body region 24 that is adjacent to the gate insulation portion 38. The semiconductor device 10 allows for control of the flow of electrons in the Z-direction between the n-type source region 26 and the n-type drift region 22.

The trench insulation layer 34 further includes a lower insulation portion 40, which covers the side wall 30 and the bottom wall 32 of the gate trench S1_*n* between the field plate electrode 18 and the semiconductor layer 14, and an intermediate insulation portion 42, which is located between the field plate electrode 18 and the gate electrode 20 in the depth direction of the gate trench S1_*n*. The lower insulation portion 40 may have a thickness from the side wall 30 of the gate trench S1_*n* that is greater than that of the gate insulation portion 38. In one example, the trench insulation layer 34 may be formed from $SiO_2$.

The insulation layer 16 is formed on the semiconductor layer 14 and covers the gate electrode 20, which is embedded in the gate trench S1_*n*, and the trench insulation layer 34. The insulation layer 16 may include a cap insulation layer (not shown) that covers the upper surface 20B of the gate electrode 20.

The insulation layer 16 includes a contact trench 44 and a contact region 46, which is adjacent to the bottom wall of the contact trench 44. The contact trench 44 extends through the insulation layer 16 and the source region 26 to the body region 24. The contact region 46 is a p-type region containing a p-type impurity. The contact region 46 may have a p-type impurity concentration in a range from $1\times10^{19}$ $cm^{-3}$ to $1\times10^{21}$ $cm^{-3}$, inclusive, which is higher than that of the body region 24. A source contact 48 is embedded in the contact trench 44. A source interconnection 50 is formed on the insulation layer 16 and electrically connected via the source contact 48 to the contact region 46.

As shown in FIG. 1, the semiconductor device 10 includes the plural sets of the gate trenches S1 and S2. Thus, the semiconductor device 10 may include the same number of field plate electrodes 18 as the gate trenches included in the plural sets of the gate trenches S1 and S2 and the same number of gate electrodes 20 as the gate trenches included in the plural sets of the gate trenches S1 and S2. That is, each field plate electrode 18 is embedded in a corresponding one of the gate trenches in the plural sets of the gate trenches S1 and S2. In the same manner, each gate electrode 20 is embedded in a corresponding one of the gate trenches in the plural sets of the gate trenches S1 and S2.

Referring again to FIG. 1, the source interconnection 50 and a gate interconnection 52 that are formed on the insulation layer 16 will now be described.

The semiconductor device 10 further includes the gate interconnection 52, which is formed on the insulation layer 16, and the source interconnection 50, which is formed on the insulation layer 16 and separated from the gate interconnection 52. For the sake of simplicity, FIG. 1 does not show inter-metal dielectrics (IMD) that separates the source interconnection 50 from the gate interconnection 52.

The semiconductor layer 14 includes a peripheral region 54 and an inner region 56 surrounded by the peripheral region 54 in plan view. The gate interconnection 52 includes a peripheral gate interconnection portion 58, which is located in the peripheral region 54 in plan view, and an inner gate interconnection portion 60, which is located in the inner region 56 in plan view. The boundary between the peripheral region 54 and the inner region 56 is shown by the double-dashed line in FIG. 1. The semiconductor layer 14 covers the semiconductor substrate 12. In one example, the periphery of the semiconductor layer 14 substantially overlaps the periphery of the semiconductor substrate 12 in plan view. Thus, the periphery of the peripheral region 54 may also substantially overlap the periphery of the semiconductor substrate 12 in plan view.

The inner region 56 is rectangular and slightly smaller than the upper surface of the semiconductor layer 14. In the example of FIG. 1, the upper surface of the semiconductor layer 14 is rectangular. The lateral direction and the longitudinal direction of the upper surface of the semiconductor layer 14 respectively correspond to the X-direction and the Y-direction.

The peripheral region 54 has the form of a rectangular frame surrounding the inner region 56. Thus, in the example of FIG. 1, the boundary of the peripheral region 54 and the inner region 56 is rectangular. The peripheral region 54 is located between the rectangular periphery of the semiconductor layer 14 and the inner region 56. The inner region 56, which may also be referred to as the active region, forms the main part of the MISFET, that is, the main part contributing to the operation of the transistor.

The peripheral gate interconnection portion 58, which is located in the peripheral region 54, may be formed at least partially surrounding the inner region 56. The peripheral gate interconnection portion 58 extends along the border of the inner region 56 and the peripheral region 54 in the peripheral region 54.

The peripheral gate interconnection portion 58 includes a gate finger 58A1, extending in the X-direction in plan view, and a gate finger 58B1, extending in the Y-direction in plan view. The gate finger 58A1 is formed near side 12C of the semiconductor substrate 12 in plan view. The gate finger 58B1 is formed near side 12D of the semiconductor substrate 12 in plan view. The gate finger 58A1 has an end connected to an end of the gate finger 58B1.

The peripheral gate interconnection portion 58 further includes a gate finger 58A2, extending in the X-direction in plan view, and a gate finger 58B2, extending in the Y-direction in plan view. The gate finger 58A2 is formed near side 12E of the semiconductor substrate 12 in plan view. The gate finger 58B2 is formed near side 12F of the semiconductor substrate 12 in plan view. One end of the gate finger 58A2 is connected to the end of the gate finger 58B1 that is not connected to the gate finger 58A1. The other end of the gate finger 58A2 is connected to an end of the gate finger 58B2.

In the example of FIG. 1, the gate finger 58A1 is shorter than the gate finger 58A2. Thus, the gate finger 58A1 is separated from the gate finger 58B2. The source interconnection 50 extends between the gate finger 58A1 and the gate finger 58B2.

In this manner, the peripheral gate interconnection portion 58, which at least partially surrounds the rectangular inner region 56, forms an open loop having the form of a rectangular frame in plan view. The open part in the loop of the peripheral gate interconnection portion 58 corresponds to a gap between the gate finger 58A1 and the gate finger 58B2. A peripheral source interconnection portion 64 and an inner source interconnection portion 66, which will be described later, are connected through the gap.

The peripheral gate interconnection portion 58 may include a gate pad 62. The gate pad 62 may be arranged at a position separated from the open part in the loop of the peripheral gate interconnection portion 58. In the example of FIG. 1, the open part in the loop of the peripheral gate interconnection portion 58 is located near side 12C. The gate pad 62 is connected to the gate finger 58A2 located near side 12E, which is opposite to side 12C. In a further example, the gate pad 62 may be connected to another gate finger included in the peripheral gate interconnection portion 58.

The inner gate interconnection portion 60 may include a gate finger 60B, extending in the Y-direction in plan view, and at least one other gate finger intersecting the gate finger 60B in plan view. In the present embodiment, the gate finger 60B is connected to the gate finger 58A2. The at least one other gate finger includes a gate finger 60A extending in the X-direction in plan view. The gate finger 60A intersects the gate finger 60B at, for example, a central part of the inner region 56 in plan view.

The gate finger 60B of the inner gate interconnection portion 60 extends in the same direction (Y-direction) as the gate fingers 58B1 and 58B2 of the peripheral gate interconnection portion 58. When the peripheral region 54 and the inner region 56 both include gate fingers extending in the same direction (Y-direction), plural first sets of the gate trenches S1 can be arranged next to each other in the X-direction. This allows the length of the gate trench S1_*n* to be reduced. In the example of FIG. 1, two first sets of the gate trenches S1 are arranged next to each other in the X-direction. Each gate trench S1_*n* of the first set has a length of approximately ¼ of the dimension of side 12C.

The gate finger 60A of the inner gate interconnection portion 60 extends in the same direction (X-direction) as the gate fingers 58A1 and 58A2 of the peripheral gate interconnection portion 58. When the peripheral region 54 and the inner region 56 both include gate fingers extending in the same direction (X-direction), plural second sets of the gate trenches S2 can be arranged next to each other in the Y-direction. This allows the length of the gate trench S2_*n* to be reduced. In the example of FIG. 1, two second sets of the gate trenches S2 are arranged next to each other in the Y-direction. Each gate trench S2_*n* of the second set has a length of approximately ¼ of the dimension of side 12D.

In the example of FIG. 1, the dimension of side 12D is greater than the dimension of side 12C. Thus, the length of the gate trench S2_*n* is greater than the length of the gate trench S1_*n*. In one example, the number of the relatively short gate trenches S1_*n* may be greater than the number of the relatively long gate trenches S2_*n*. In another example, the length of the gate trench S2_*n* may be equal to the length of the gate trench S1_*n* or smaller than the length of the gate trench S1_*n*.

The source interconnection 50 includes the peripheral source interconnection portion 64, located in the peripheral region 54, and the inner source interconnection portion 66, located in the inner region 56.

In the example of FIG. 1, the peripheral source interconnection portion 64 extends continuously in the peripheral region 54, except for the part where the gate pad 62 is formed, and surrounds the inner region 56 in plan view. The peripheral source interconnection portion 64 is connected to the inner source interconnection portion 66 at the region between the gate finger 58A1 and the gate finger 58B2 in plan view. Thus, the potential at the peripheral source interconnection portion 64 is the same as the potential at the inner source interconnection portion 66.

The inner source interconnection portion 66 may be separated from both of the peripheral gate interconnection portion 58 and the inner gate interconnection portion 60 by a predetermined distance that is set taking the breakdown voltage into account. In the example of FIG. 1, the inner source interconnection portion 66 is separated by a fixed distance from the periphery of the gate fingers 60A and 60B so as to have a cross-shaped slit in plan view.

The plural sets of the gate trenches S1 and S2 at least partially overlap both of the source interconnection 50 and the gate interconnection 52 in plan view. Each set of gate trenches is arranged to intersect one gate finger in plan view where the gate electrode 20 embedded in each gate trench is connected to the gate interconnection 52.

The gate trench S1_*n* in each first set extends in the X-direction in plan view and intersects one of the gate fingers 58B1, 58B2, and 60B, which extend in the Y-direction in plan view. In the same manner, the gate trench S2_*n*, which extends in the Y-direction in plan view, in each second set intersects one of the gate fingers 58A1, 58A2, and 60A, which extend in the X-direction in plan view.

In one example, the gate electrode 20 embedded in each gate trench S1_*n* of the first set intersecting the gate finger 60B is electrically connected to the gate finger 60B in the region where the gate trench S1_*n* of the first set intersects the gate finger 60B.

In the same manner, the gate electrode 20 embedded in each gate trench S2_*n* of the second set intersecting the gate finger 58A1 or 58A2 is electrically connected to the gate finger 58A1 or 58A2 in the region where the gate trench S2_*n* of the second set intersects the gate finger 58A1 or 58A2 in plan view.

Each gate trench S1_*n* of the first set intersecting the gate finger 58B1 or 58B2 of the peripheral gate interconnection portion 58 extends across the inner region 56 and the peripheral region 54. Each gate trench S1_*n* of the first set intersecting the gate finger 60B of the inner gate interconnection portion 60 is located entirely in the inner region 56.

In the same manner, each gate trench S2_*n* of the second set intersecting the gate finger 58A1 or 58A2 of the peripheral gate interconnection portion 58 extends across the inner region 56 and the peripheral region 54. Each gate trench S2_*n* of the second set intersecting the gate finger 60A of the inner gate interconnection portion 60 is entirely located in the inner region 56.

A gate finger extending in the Y-direction in plan view may intersect two or more first sets of the gate trenches S1. In the example of FIG. 1, the gate finger 60B intersects two first sets of the gate trenches S1 in plan view.

A gate finger extending in the X-direction in plan view may intersect two or more second sets of the gate trenches S2. In the example of FIG. 1, the gate finger 60A intersects two second sets of the gate trenches S2.

In the example of FIG. 1, the layout of the source interconnection 50 and the gate interconnection 52 allows each gate trench S1_*n* of the first set to have a length of ⅓ or less of the dimension of side 12C. In the same manner, each gate trench S2_*n* of the second set may have a length of ⅓ or less of the dimension of side 12D.

Figure 3:
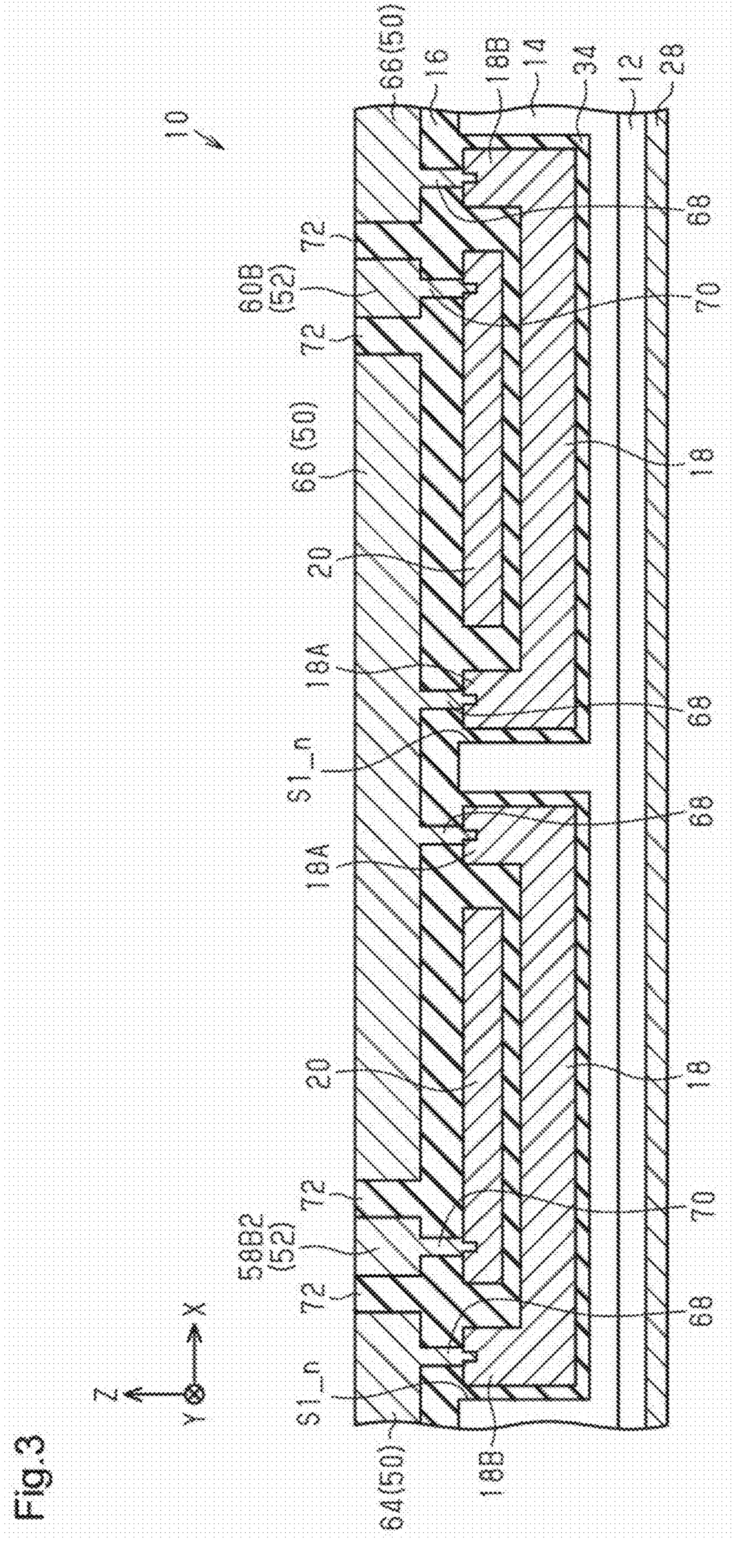
FIG. 3 is a schematic cross-sectional view of the semiconductor device taken along line F3-F3 in FIG. 1.

FIG. 3 is a schematic cross-sectional view of the semiconductor device taken along line F3-F3 in FIG. 1, and shows an XZ cross section of the gate trenches S1 of two adjacent first sets where two gate trenches S1_*n* are formed in the semiconductor layer 14.

The field plate electrode 18 and the gate electrode 20 are embedded in each gate trench S1_*n*. The gate electrode 20 is located above the field plate electrode 18. The field plate electrode 18 includes two ends 18A and 18B connected to the source interconnection 50. The ends 18A and 18B extend in the Z-direction from the bottom of the gate trench S1_*n* to an open part of the gate trench S1_*n*. Thus, the gate electrode 20 is not located above the ends 18A and 18B.

The two ends 18A and 18B of the field plate electrode 18 are connected by two field plate contacts 68 to the source interconnection 50. The two ends 18A and 18B of the field plate electrode 18 may both be connected to the inner source interconnection portion 66. Alternatively, one of the two ends 18A and 18B of the field plate electrode 18 may be connected to the inner source interconnection portion 66, and the other one of the two ends 18A and 18B may be connected to the peripheral source interconnection portion 64. For example, in the field plate electrode 18 embedded in each gate trench S1_*n* of the first set that intersects the gate finger 60B of the inner gate interconnection portion 60 in plan view, the two ends 18A and 18B are both connected to the inner source interconnection portion 66. In the field plate electrode 18 embedded in each gate trench S2_*n* of the second set intersecting the gate finger 58A1 or 58A2 of the second set intersecting the peripheral gate interconnection portion 58 in plan view, one of the two ends 18A and 18B is connected to the inner source interconnection portion 66, and the other one of the two ends 18A and 18B is connected to the peripheral source interconnection portion 64.

In the example of FIG. 3, the two ends 18A and 18B of the right field plate electrode 18 are both connected to the inner source interconnection portion 66. The ends 18A and 18B of the left field plate electrode 18 are connected to the inner source interconnection portion 66 and the peripheral source interconnection portion 64, respectively.

The gate electrode 20 embedded in the gate trench S1_*n* is connected to the gate interconnection 52. More specifically, the gate electrode 20 is connected to the gate interconnection 52 by a gate contact 70 extending through the insulation layer 16. The field plate electrode 18 is connected to the source interconnection 50 by two field plate contacts 68, whereas the gate electrode 20 is connected to the gate interconnection 52 by one gate contact 70. In the example of FIG. 3, the gate interconnection 52, to which the gate electrode 20 is connected, is a gate finger extending in the Y-direction. More specifically, in FIG. 3, the right gate electrode 20 is connected to the gate finger 60B, and the left gate electrode 20 is connected to the gate finger 58B2.

An insulation layer 72 is formed between the source interconnection 50 and the gate interconnection 52. The insulation layer 72 electrically isolates the source interconnection 50 and the gate interconnection 52. The insulation layer 72 corresponds to an EVID.

The cross section of the gate trenches S2 in two adjacent second sets taken along a YZ plane is similar to that shown in FIG. 3 except in that the gate trench S2_*n* differs in length from the gate trench S1_*n*. In the example of FIG. 1, the gate trench S2_*n* is longer than the gate trench S1_*n*. However, the gate trench S2_*n* may be shorter than the gate trench S1_*n* or have the same length as the gate trench S1_*n*.

The operation of the semiconductor device 10 in accordance with the present embodiment will now be described.

In the semiconductor device 10 of the present embodiment, the field plate electrodes 18 each include the two ends 18A and 18B connected to the source interconnection 50. Since the two ends 18A and 18B of the field plate electrode 18 are connected to the source interconnection 50, the gate-trench length that affects the resistance $R_S$ of the field plate electrode 18 may be substantially reduced by approximately ½ as compared with when only one end is connected to the source interconnection 50.

Further, in the semiconductor device 10 of the present embodiment, the peripheral gate interconnection portion 58 includes the gate finger 58A1 or 58A2 (first gate finger) extending in the X-direction in plan view, and the inner gate interconnection portion 60 includes the gate finger 60B (second gate finger) extending in the Y-direction in plan view. Further, the gate trench S1_*n*, which extends in the X-direction in plan view, of a first set intersects the gate finger 60B (second gate finger), and the gate trench S2_*n*, which extends in the Y-direction in plan view, of a second set intersects the gate finger 58A1 or 58A2 (first gate finger).

In this configuration, the gate trench S1_*n* extending in the X-direction in plan view and the gate trench S2_*n* extending in the Y-direction in plan view each intersect the corresponding one of the gate fingers and is located in the semiconductor layer 14 formed on the semiconductor substrate 12. This reduces warping of the semiconductor substrate 12 during wafer processing in comparison with when the gate trenches all extend in the same direction.

In a MISFET having a split-gate structure in which a field plate electrode and a gate electrode are embedded in a gate trench, the potential current flowing to the resistance $R_S$ of the field plate electrode may increase the potential $V_{BS}$ at the field plate electrode. Such an increase in the potential $V_{BS}$ will lower the breakdown voltage of the MISFET. This may cause a false turn-on resulting in the flow of avalanche current. When the potential current flowing to the resistance $R_G$ of a gate electrode causes the potential $V_G$ at the gate electrode to increase and exceed a threshold voltage Vth, a self turn-on that erroneously turns on the MISFET may occur. Such effects are referred to as collectively referred to as a shoot-through. Switching loss will increase when an unexpected shoot-through current flows through a circuit including a MISFET. It is thus desirable that shoot-through does not occur.

A shoot-through is caused by the resistance $R_S$ of a field plate electrode and/or the potential current flowing through the resistance $R_G$ of a gate electrode. Thus, a shoot-through can be avoided by reducing the resistance $R_S$ and the resistance $R_G$. A longer gate trench will increase the resistance $R_S$ of the field plate electrode and the resistance $R_G$ of the gate electrode. Thus, reduction in the gate-trench length, which affects the resistance $R_S$ and the resistance $R_G$, will effectively avoid shoot-through, and changes to the MISFET manufacturing process will not be necessary. The semiconductor device 10 of the present disclosure substantially reduces the gate-trench length and thus limits the occurrence of a shoot-through.

The semiconductor device 10 of the present embodiment has the advantages described below.

(1) Each of the field plate electrodes 18 includes the two ends 18A and 18B connected to the source interconnection 50. Since the two ends 18A and 18B of the field plate electrode 18 are connected to the source interconnection 50, the gate-trench length that affects the resistance $R_S$ of the field plate electrode 18 may be substantially reduced by approximately ½ as compared with when only one end is connected to the source interconnection 50.

(2) The peripheral gate interconnection portion 58 includes the gate finger 58A1 or 58A2 (first gate finger) extending in the X-direction in plan view, and the inner gate interconnection portion 60 includes the gate finger 60B (second gate finger) extending in the Y-direction in plan view. Further, the gate trench S1_*n*, which extends in the X-direction in plan view, of a first set intersects the gate finger 60B (second gate finger), and the gate trench S2_*n*, which extends in the Y-direction in plan view, of a second set intersects the gate finger 58A1 or 58A2 (first gate finger).

In this configuration, the gate trench S1_*n*, which extends in the X-direction in plan view, and the gate trench S2_*n*, which extends in the Y-direction in plan view, are both arranged in the semiconductor layer 14 formed on the semiconductor substrate 12 to intersect the corresponding one of the gate fingers. This reduces warping of the semiconductor substrate 12 during wafer processing in comparison with when the gate trenches all extend in the same direction.

(3) The inner gate interconnection portion 60 further includes at least one further gate finger 60A intersecting the gate finger 60B (second gate finger) in plan view. In this configuration, the peripheral region 54 and the inner region 56 both include gate fingers extending in the same direction (X-direction). This allows two second sets of the gate trenches S2 to be arranged adjacent to each other in the Y-direction. As a result, the length of the gate trench S2_*n* can be reduced.

(4) The peripheral gate interconnection portion 58 further includes the gate finger 58B1 or 58B2 (fourth gate finger) extending in the Y-direction in plan view. In this configuration, the peripheral region 54 and the inner region 56 both include gate fingers extending in the same direction (Y-direction). This allows two first sets of the gate trenches S1 to be arranged adjacent to each other in the X-direction. As a result, the length of the gate trench S1_*n* can be reduced.

First Modified Example

Figure 4:
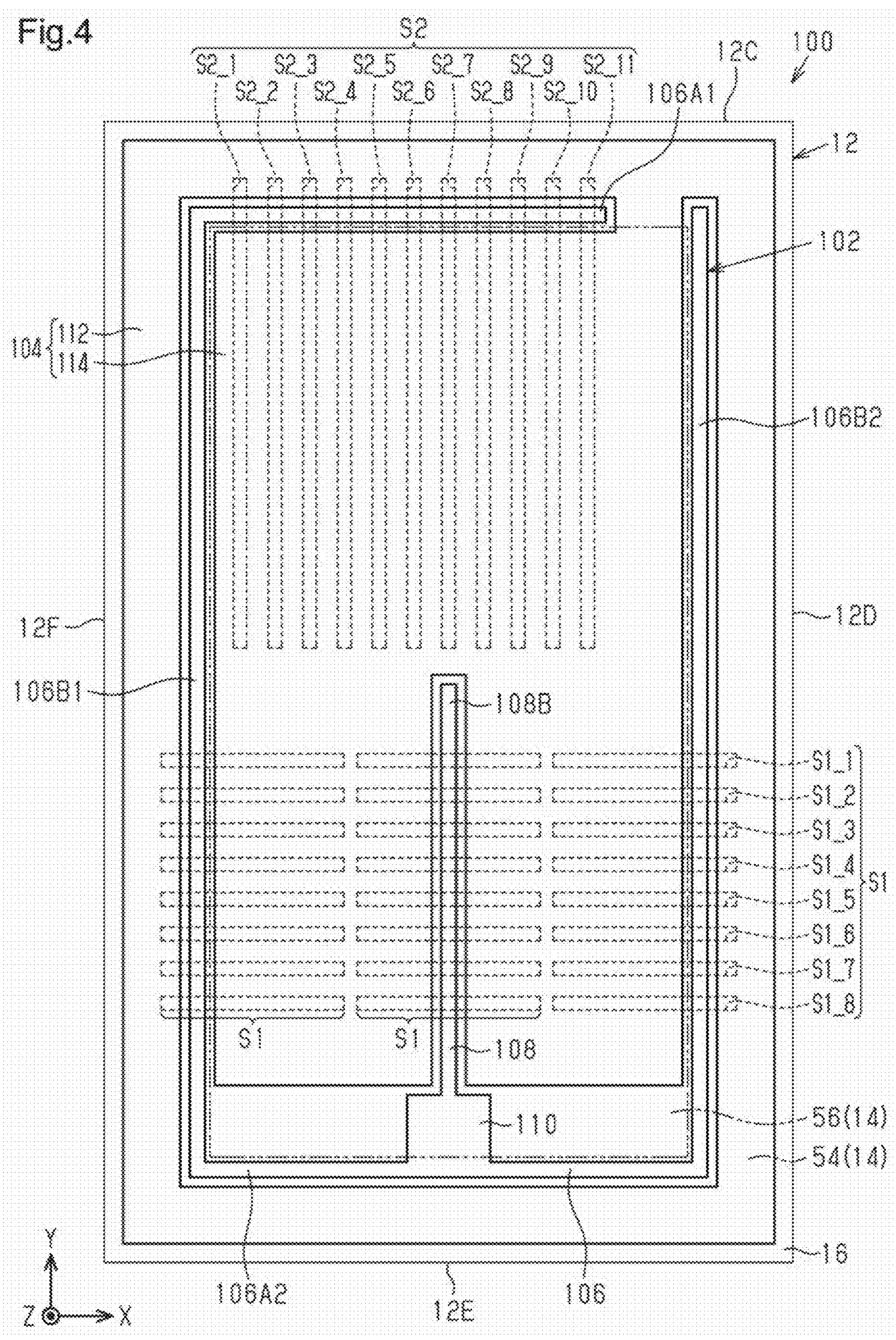
FIG. 4 is a schematic plan view exemplifying a first modified example of the semiconductor device.

FIG. 4 is a schematic plan view exemplifying a semiconductor device 100 in accordance with a first modified example of the above embodiment. In FIG. 4, same reference characters are given to those elements that are the same as the corresponding elements in the semiconductor device 10 of FIG. 1. Components that are the same as the corresponding components of the semiconductor device 10 will not be described in detail.

The semiconductor device 100 of the first modified example includes a gate interconnection 102, which is formed on the insulation layer 16, and a source interconnection 104, which is formed on the insulation layer 16 and separated from the gate interconnection 102. For the sake of simplicity, FIG. 4 does not show the IMD that separates the source interconnection 104 from the gate interconnection 102.

The gate interconnection 102 includes a peripheral gate interconnection portion 106, which is located in the peripheral region 54 in plan view, and an inner gate interconnection portion 108, which is located in the inner region 56 in plan view. The peripheral gate interconnection portion 106, which is located in the peripheral region 54, may be formed at least partially surrounding the inner region 56. The peripheral gate interconnection portion 106 extends along the border of the inner region 56 and the peripheral region 54 in the peripheral region 54.

The peripheral gate interconnection portion 106 includes a gate finger 106A1, extending in the X-direction in plan view, and a gate finger 106B1, extending in the Y-direction in plan view. The gate finger 106A1 is formed near side 12C of the semiconductor substrate 12 in plan view. The gate finger 106B1 is formed near side 12F of the semiconductor substrate 12 in plan view. The gate finger 106A1 has an end connected to an end of the gate finger 106B1.

The peripheral gate interconnection portion 106 further includes a gate finger 106A2, extending in the X-direction in plan view, and a gate finger 106B2, extending in the Y-direction in plan view. The gate finger 106A2 is formed near side 12E of the semiconductor substrate 12 in plan view. The gate finger 106B2 is formed near side 12D of the semiconductor substrate 12 in plan view. One end of the gate finger 106A2 is connected to the end of the gate finger 106B1 that is not connected to the gate finger 106A1. The other end of the gate finger 106A2 is connected to an end of the gate finger 106B2.

In the example of FIG. 4, the gate finger 106A1 is shorter than the gate finger 106A2. Thus, the gate finger 106A1 is separated from the gate finger 106B2. The source interconnection 104 extends between the gate finger 106A1 and the gate finger 106B2.

In this manner, the peripheral gate interconnection portion 106, which at least partially surrounds the rectangular inner region 56, forms an open loop having the form of a rectangular frame in plan view. The open part in the loop of the peripheral gate interconnection portion 106 corresponds to a gap between the gate finger 106A1 and the gate finger 106B2. A peripheral source interconnection portion 112 and an inner source interconnection portion 114, which will be described later, are connected through the gap.

The inner gate interconnection portion 108 includes a gate finger 108B, extending in the Y-direction in plan view, and a gate pad 110, connected to the gate finger 108B. The gate pad 110 may be arranged at a position separated from the open part in the loop of the peripheral gate interconnection portion 106. In the example of FIG. 4, the open part in the loop of the peripheral gate interconnection portion 106 is located near side 12C. The gate pad 110 is connected to the gate finger 106A2 located near side 12E, which is opposite to side 12C. The peripheral gate interconnection portion 106 is connected by the gate pad 110 to the inner gate interconnection portion 108. In a further example, the gate pad 110 may be connected to another gate finger that is included in the peripheral gate interconnection portion 106.

The gate finger 108B of the inner gate interconnection portion 108 extends in the same direction (Y-direction) as the gate fingers 106B1 and 106B2 of the peripheral gate interconnection portion 106. When the peripheral region 54 and the inner region 56 both include gate fingers extending in the same direction (Y-direction), plural first sets of the gate trenches S1 can be arranged next to each other in the X-direction. This allows the length of the gate trench S1_*n* to be reduced. In the example of FIG. 4, three first sets of the gate trenches S1 are arranged next to one another in the X-direction. Each gate trench S1_*n* of the first set has a length of approximately ⅓ of the dimension of side 12C.

The gate finger 108B may have a length of approximately ½ or less of the dimension of side 12D. In this case, even if the length of each gate trench S2_*n* in the second set is approximately ½ of the dimension of side 12D, the second set of the gate trenches S2 may be arranged without overlapping the gate finger 108B in plan view.

In the example of FIG. 4, the dimension of side 12D is greater than the dimension of side 12C. Thus, the length of the gate trench S2_*n* is greater than the length of the gate trench S1_*n*. In one example, the number of the relatively short gate trenches S1_*n* may be greater than the number of the relatively long gate trenches S2_*n*. In another example, the length of the gate trench S2_*n* may be equal to the length of the gate trench S1_*n* or smaller than the length of the gate trench S1_*n*.

The source interconnection 104 includes a peripheral source interconnection portion 112, located in the peripheral region 54, and an inner source interconnection portion 114, located in the inner region 56.

In the example of FIG. 4, the peripheral source interconnection portion 112 extends continuously in the peripheral region 54 and surrounds the inner region 56 in plan view. The peripheral source interconnection portion 112 is connected to the inner source interconnection portion 114 at the region between the gate finger 106A1 and the gate finger 106B2 in plan view. Thus, the potential at the peripheral source interconnection portion 112 is the same as the potential at the inner source interconnection portion 114.

The inner source interconnection portion 114 may be separated from both of the peripheral gate interconnection portion 106 and the inner gate interconnection portion 108 by a predetermined distance that is set taking the breakdown voltage into account. In the example of FIG. 4, the inner source interconnection portion 114 is separated by a fixed distance from the periphery of the gate fingers 108B so as to have a slit extending in the Y-direction in plan view.

The plural sets of the gate trenches S1 and S2 at least partially overlap both of the gate interconnection 102 and the source interconnection 104 in plan view. Each set of gate trenches is arranged to intersect one gate finger in plan view where the gate electrode 20 embedded in each gate trench is connected to the gate interconnection 102.

The gate trench S1_*n* in each first set extends in the X-direction in plan view and intersects one of the gate fingers 106B1, 106B2, and 108B, which extend in the Y-direction in plan view. In the same manner, the gate trench S2_*n*, which extends in the Y-direction in plan view, in each second set intersects the gate finger 106A1, which extends in the X-direction in plan view.

In one example, the gate electrode 20 embedded in each gate trench S1_*n* of the first set intersecting the gate finger 108B is electrically connected to the gate finger 108B in the region where the gate trench S1_*n* of the first set intersects the gate finger 108B.

In the same manner, the gate electrode 20 embedded in each gate trench S2_*n* of the second set intersecting the gate finger 106A1 is electrically connected to the gate finger 106A1 in the region where the gate trench S2_*n* of the second set intersects the gate finger 106A1 in plan view.

Each gate trench S1_*n* of the first set intersecting the gate finger 106B1 or 106B2 of the peripheral gate interconnection portion 106 extends across the inner region 56 and the peripheral region 54. Each gate trench S1_*n* of the first set intersecting the gate finger 108B of the inner gate interconnection portion 108 is entirely located in the inner region 56.

In the same manner, each gate trench S2_*n* of the second set intersecting the gate finger 106A1 of the peripheral gate interconnection portion 106 extends across the inner region 56 and the peripheral region 54.

In the example of FIG. 4, each first set of the gate trenches S1 includes eight gate trenches S1_1 to S1_8 that are arranged parallel to one another at equal intervals, and each second set of the gate trenches S2 includes eleven gate trenches S2_1 to S2_11 that are arranged parallel to each other at equal intervals. The plural sets of the gate trenches S1 and S2 include three first sets of the gate trenches S1 and one second set of the gate trenches S2.

In the example of FIG. 4, the layout of the gate interconnection 102 and the source interconnection 104 allows each gate trench S1_*n* of the first set to have a length of ⅓ or less of the dimension of side 12C. In the same manner, each gate trench S2_*n* of the second set may have a length of ½ or less of the dimension of side 12D.

The connection relationship of the field plate electrode 18 and the source interconnection 104 (peripheral source interconnection portion 112 and inner source interconnection portion 114) may be applied to the connection of the field plate electrode 18 and the source interconnection 50.

Second Modified Example

Figure 5:
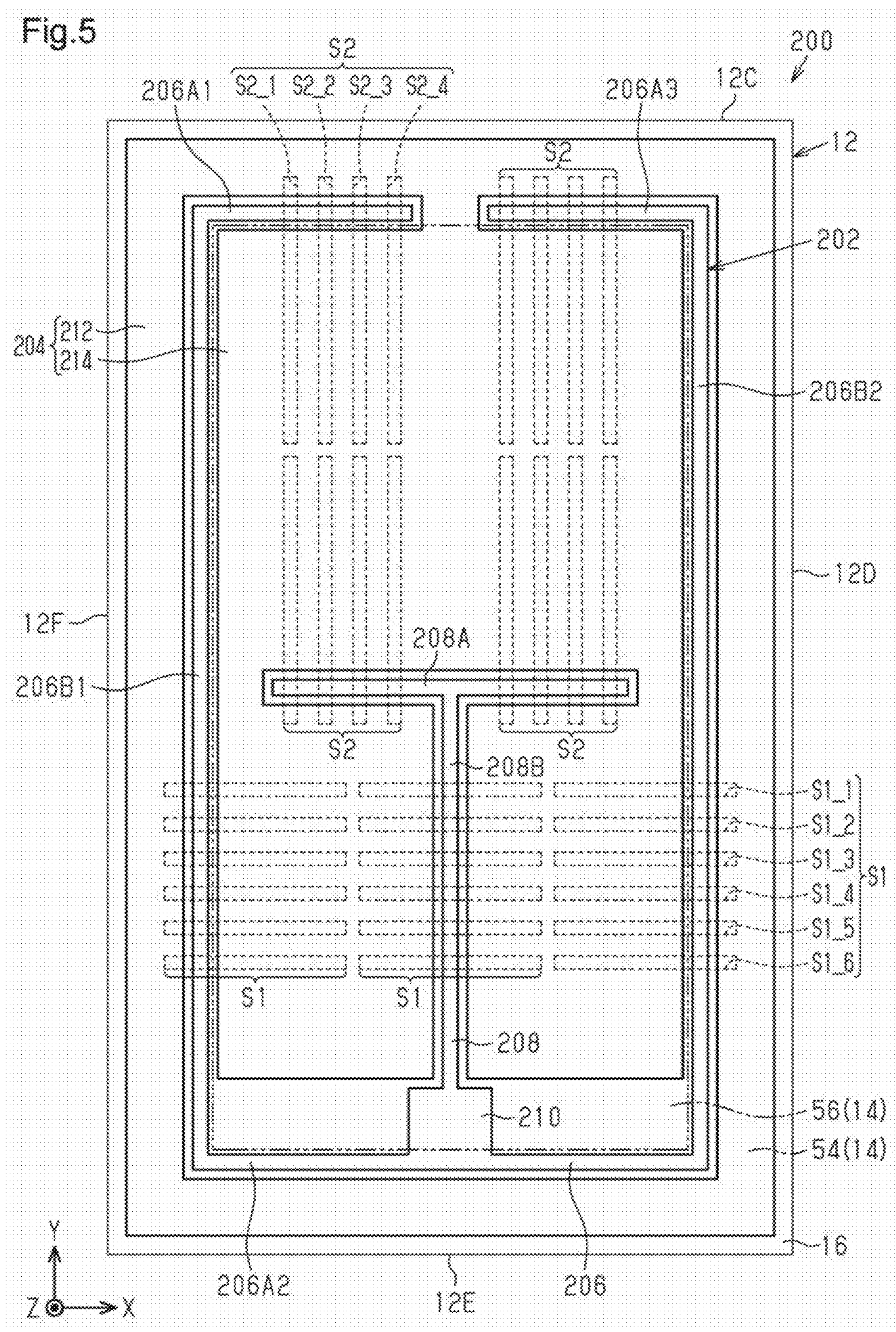
FIG. 5 is a schematic plan view exemplifying a second modified example of the semiconductor device.

FIG. 5 is a schematic plan view exemplifying a semiconductor device 200 in accordance with a second modified example of the above embodiment. In FIG. 5, same reference characters are given to those elements that are the same as the corresponding elements in the semiconductor device 10 of FIG. 1. Components that are the same as the corresponding components of the semiconductor device 10 will not be described in detail.

The semiconductor device 200 of the second modified example includes a gate interconnection 202, which is formed on the insulation layer 16, and a source interconnection 204, which is formed on the insulation layer 16 and separated from the gate interconnection 202. For the sake of simplicity, FIG. 5 does not show the IMD that separates the source interconnection 204 from the gate interconnection 202.

The gate interconnection 202 includes a peripheral gate interconnection portion 206, which is located in the peripheral region 54 in plan view, and an inner gate interconnection portion 208, which is located in the inner region 56 in plan view. The peripheral gate interconnection portion 206, which is located in the peripheral region 54, may be formed at least partially surrounding the inner region 56. The peripheral gate interconnection portion 206 extends along the border of the inner region 56 and the peripheral region 54 in the peripheral region 54.

The peripheral gate interconnection portion 206 includes a gate finger 206A1, extending in the X-direction in plan view, and a gate finger 206B1, extending in the Y-direction in plan view. The gate finger 206A1 is formed near side 12C of the semiconductor substrate 12 in plan view. The gate finger 206B1 is formed near side 12F of the semiconductor substrate 12 in plan view. The gate finger 206A1 has an end connected to an end of the gate finger 206B1.

The peripheral gate interconnection portion 206 further includes a gate finger 206A2, extending in the X-direction in plan view, a gate finger 206B2 extending in the Y-direction in plan view, and a gate finger 206A3, extending in the X-direction in plan view. The gate finger 206A2 is formed near side 12E of the semiconductor substrate 12 in plan view. The gate finger 206B2 is formed near side 12D of the semiconductor substrate 12 in plan view. The gate finger 206A3 is formed near side 12C of the semiconductor substrate 12 in plan view. One end of the gate finger 206A2 is connected to the end of the gate finger 206B1 that is not connected to the gate finger 206A1. The other end of the gate finger 206A2 is connected to an end of the gate finger 206B2. One end of the gate finger 206A3 is connected to the end of the gate finger 206B2 that is not connected to the gate finger 206A2.

In the example of FIG. 5, the total length of the gate finger 206A1 and the gate finger 206A3 is shorter than the length of the gate finger 206A2. Thus, the gate finger 206A1 is separated from the gate finger 206A3. The source interconnection 204 extends between the gate finger 206A1 and the gate finger 206A3.

In this manner, the peripheral gate interconnection portion 206, which at least partially surrounds the rectangular inner region 56, forms an open loop having the form of a rectangular frame in plan view. The open part in the loop of the peripheral gate interconnection portion 206 corresponds to a gap between the gate finger 206A1 and the gate finger 206A3. A peripheral source interconnection portion 212 and an inner source interconnection portion 214, which will be described later, are connected through the gap.

The inner gate interconnection portion 208 includes a gate finger 208A extending in the X-direction in plan view, a gate finger 208B extending in the Y-direction, and a gate pad 210. The gate pad 210 may be arranged at a position separated from the open part in the loop of the peripheral gate interconnection portion 206. In the example of FIG. 5, the open part in the loop of the peripheral gate interconnection portion 206 is located near side 12C. The gate pad 210 is connected to the gate finger 206A2 located near side 12E, which is opposite to side 12C. The gate finger 208A forms a T-shaped junction with the gate finger 208B. Further, the gate finger 208B is connected to the gate pad 210. Thus, the peripheral gate interconnection portion 206 is connected by the gate pad 210 to the gate finger 208B. In a further example, the gate pad 210 may be connected to another gate finger that is included in the peripheral gate interconnection portion 206.

The gate finger 208A of the inner gate interconnection portion 208 extends in the same direction (X-direction) as the gate fingers 206A1, 206A2, and 206A3 of the peripheral gate interconnection portion 206. When the peripheral region 54 and the inner region 56 both include gate fingers extending in the same direction (X-direction), plural second sets of the gate trenches S2 can be arranged next to each other in the Y-direction. This allows the length of the gate trench S2_*n* to be reduced. In the example of FIG. 5, two second sets of the gate trenches S2 are arranged next to each other in the Y-direction. Each gate trench S2_n of the second set has a length of approximately ⅓ of the dimension of side 12D.

The gate finger 208B of the inner gate interconnection portion 208 extends in the same direction (Y-direction) as the gate fingers 206B1 and 206B2 of the peripheral gate interconnection portion 206. When the peripheral region 54 and the inner region 56 both include gate fingers extending in the same direction (Y-direction), plural first sets of the gate trenches S1 can be arranged next to each other in the X-direction. This allows the length of the gate trench S1_n to be reduced. In the example of FIG. 5, three first sets of the gate trenches S1 are arranged next to one another in the X-direction. Each gate trench S1_n of the first set has a length of approximately ⅓ of the dimension of side 12C.

In the example of FIG. 5, the dimension of side 12D is greater than the dimension of side 12C. Thus, the length of the gate trench S2_n is greater than the length of the gate trench S1_n. In another example, the length of the gate trench S2_n may be equal to the length of the gate trench S1_n or smaller than the length of the gate trench S1_n.

The source interconnection 204 includes the peripheral source interconnection portion 212, located in the peripheral region 54, and the inner source interconnection portion 214, located in the inner region 56.

In the example of FIG. 5, the peripheral source interconnection portion 212 extends continuously in the peripheral region 54 and surrounds the inner region 56 in plan view. The peripheral source interconnection portion 212 is connected to the inner source interconnection portion 214 at the region between the gate finger 206A1 and the gate finger 206A3 in plan view. Thus, the potential at the peripheral source interconnection portion 212 is the same as the potential at the inner source interconnection portion 214.

The inner source interconnection portion 214 may be separated from both of the peripheral gate interconnection portion 206 and the inner gate interconnection portion 208 by a predetermined distance that is set taking the breakdown voltage into account. In the example of FIG. 5, the inner source interconnection portion 214 is separated by a fixed distance from the periphery of the gate finger 208A and the gate finger 208B so as to have a T-shaped slit in plan view.

The plural sets of the gate trenches S1 and S2 at least partially overlap both of the gate interconnection 202 and the source interconnection 204 in plan view. Each set of gate trenches is arranged to intersect one gate finger in plan view where the gate electrode 20 embedded in each gate trench is connected to the gate interconnection 202.

The gate trench S1_n in each first set extends in the X-direction in plan view and intersects one of the gate fingers 206B1, 206B2, and 208B, which extend in the Y-direction in plan view. In the same manner, the gate trench S2_n, which extends in the Y-direction in plan view, in each second set intersects one of the gate fingers 206A1, 206A3, and 208A, which extend in the X-direction in plan view.

In one example, the gate electrode 20 embedded in each gate trench S1_n of the first set intersecting the gate finger 208B is electrically connected to the gate finger 208B in the region where the gate trench S1_n of the first set intersects the gate finger 208B.

In the same manner, the gate electrode 20 embedded in each gate trench S2_n of the second set intersecting the gate finger 206A1 is electrically connected to the gate finger 206A1 in the region where the gate trench S2_n of the second set intersects the gate finger 206A1 in plan view.

Each gate trench S1_n of the first set intersecting the gate finger 206B1 or 206B2 of the peripheral gate interconnection portion 206 extends across the inner region 56 and the peripheral region 54. Each gate trench S1_n of the first set intersecting the gate finger 208B of the inner gate interconnection portion 208 is entirely located in the inner region 56.

In the same manner, each gate trench S2_n of the second set, intersecting the gate finger 206A1 or 206A3 of the peripheral gate interconnection portion 206, extends across the inner region 56 and the peripheral region 54.

In the example of FIG. 5, each first set of the gate trenches S1 includes six gate trenches S1_1 to S1_6 that are arranged parallel to each other at equal intervals, and each second set of the gate trenches S2 includes four gate trenches S2_1 to S2_4 that are arranged parallel to each other at equal intervals. The plural sets of the gate trenches S1 and S2 include three first sets of the gate trenches S1 and four second sets of the gate trenches S2.

In the example of FIG. 5, the layout of the gate interconnection 202 and the source interconnection 204 allows each gate trench S1_n of the first set to have a length of ⅓ or less of the dimension of side 12C. In the same manner, each gate trench S2_n of the second set may have a length of ⅓ or less of the dimension of side 12D.

The connection relationship of the field plate electrode 18 and the source interconnection 204 (peripheral source interconnection portion 212 and inner source interconnection portion 214) may be applied to the connection of the field plate electrode 18 and the source interconnection 50.

Third Modified Example

Figure 6:
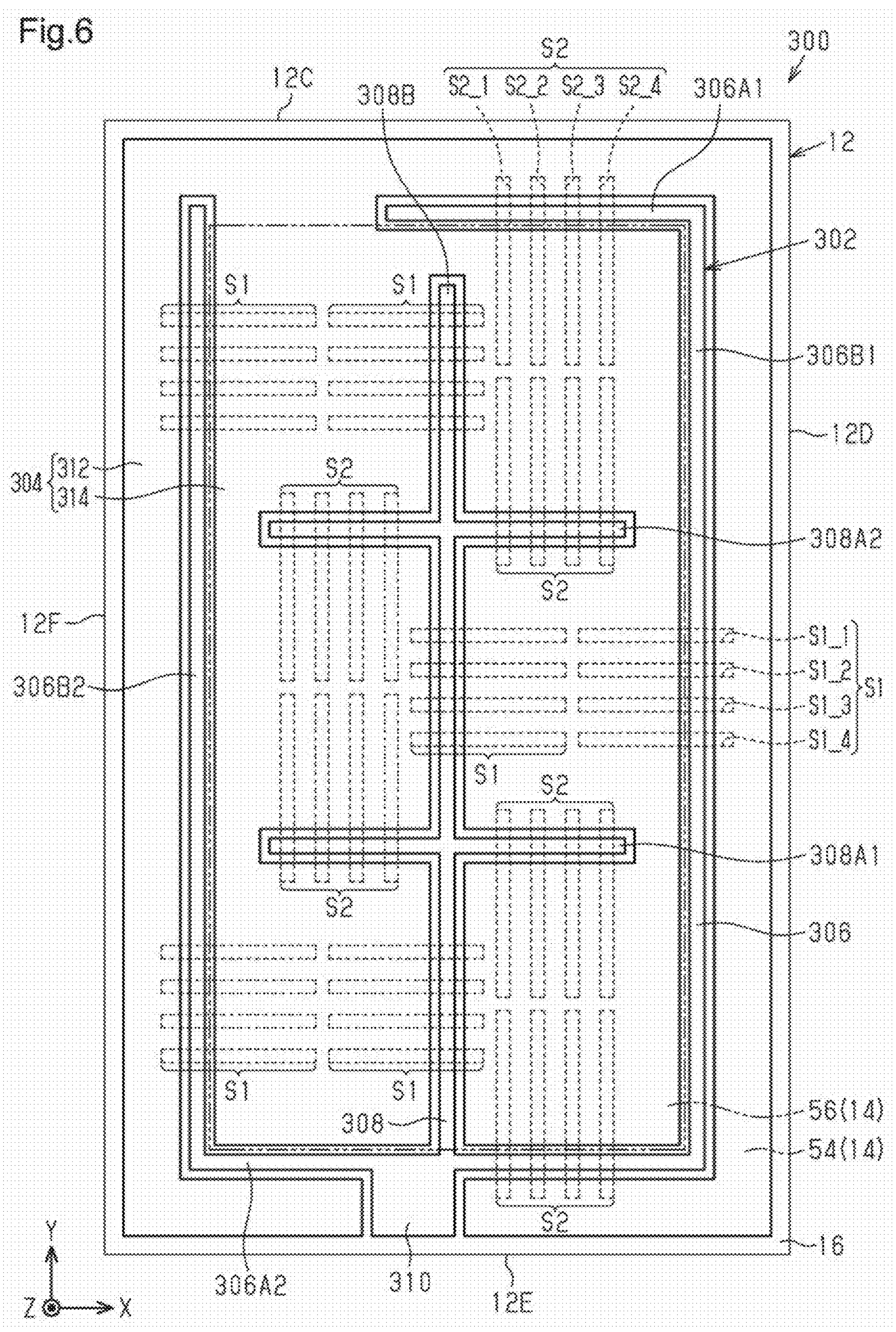
FIG. 6 is a schematic plan view exemplifying a third modified example of the semiconductor device.

FIG. 6 is a schematic plan view exemplifying a semiconductor device 300 in accordance with a third modified example of the above embodiment. In FIG. 6, same reference characters are given to those elements that are the same as the corresponding elements in the semiconductor device 10 of FIG. 1. Components that are the same as the corresponding components of the semiconductor device 10 will not be described in detail.

The semiconductor device 300 of the third modified example includes a gate interconnection 302, which is formed on the insulation layer 16, and a source interconnection 304, which is formed on the insulation layer 16 and separated from the gate interconnection 302. For the sake of simplicity, FIG. 6 does not show the IMD that separates the source interconnection 304 from the gate interconnection 302.

The gate interconnection 302 includes a peripheral gate interconnection portion 306, which is located in the peripheral region 54 in plan view, and an inner gate interconnection portion 308, which is located in the inner region 56 in plan view. The peripheral gate interconnection portion 306, which is located in the peripheral region 54, may be formed at least partially surrounding the inner region 56. The peripheral gate interconnection portion 306 extends along the border of the inner region 56 and the peripheral region 54 in the peripheral region 54.

The peripheral gate interconnection portion 306 includes a gate finger 306A1, extending in the X-direction in plan view, and a gate finger 306B1, extending in the Y-direction in plan view. The gate finger 306A1 is formed near side 12C of the semiconductor substrate 12 in plan view. the gate finger 306B1 is formed near side 12D of the semiconductor substrate 12 in plan view. The gate finger 306A1 has an end connected to an end of the gate finger 306B1.

The peripheral gate interconnection portion 306 further includes a gate finger 306A2, extending in the X-direction in plan view, and a gate finger 306B2, extending in the Y-direction in plan view. The gate finger 306A2 is formed near side 12E of the semiconductor substrate 12 in plan view. The gate finger 306B2 is formed near side 12F of the semiconductor substrate 12 in plan view. One end of the gate finger 306A2 is connected to the end of the gate finger 306B1 that is not connected to the gate finger 306A1. The other end of the gate finger 306A2 is connected to an end of the gate finger 306B2.

In the example of FIG. 6, the gate finger 306A1 is shorter than the gate finger 306A2. Thus, the gate finger 306A1 is separated from the gate finger 306B2. The source interconnection 304 extends between the gate finger 306A1 and the gate finger 306B2.

In this manner, the peripheral gate interconnection portion 306, which at least partially surrounds the rectangular inner region 56, forms an open loop having the form of a rectangular frame in plan view. The open part in the loop of the peripheral gate interconnection portion 306 corresponds to a gap between the gate finger 306A1 and the gate finger 306B2. A peripheral source interconnection portion 312 and an inner source interconnection portion 314, which will be described later, are connected through the gap.

The peripheral gate interconnection portion 306 may include a gate pad 310. The gate pad 310 may be arranged at a position separated from the open part in the loop of the peripheral gate interconnection portion 306. In the example of FIG. 6, the open part in the loop of the peripheral gate interconnection portion 306 is located near side 12C. The gate pad 310 is connected to the gate finger 306A2 located near side 12E, which is opposite to side 12C. In a further example, the gate pad 310 may be connected to another gate finger that is included in the peripheral gate interconnection portion 306.

The inner gate interconnection portion 308 may include a gate finger 308B, extending in the Y-direction in plan view, and at least one other gate finger intersecting the gate finger 308B in plan view. In the present embodiment, the gate finger 308B is connected to the gate finger 306A2. The at least one other gate finger includes two gate fingers 308A1 and 308A2 extending in the X-direction in plan view. In the example of FIG. 6, the gate finger 306A2, the gate finger 308A1, the gate finger 308A2, and the gate finger 306A1 are arranged parallel to one another at equal intervals.

The gate finger 308B of the inner gate interconnection portion 308 extends in the same direction (Y-direction) as the gate fingers 306B1 and 306B2 of the peripheral gate interconnection portion 306. When the peripheral region 54 and the inner region 56 both include gate fingers extending in the same direction (Y-direction), plural first sets of the gate trenches S1 can be arranged next to each other in the X-direction. This allows the length of the gate trench S1_*n* to be reduced. In the example of FIG. 6, two first sets of the gate trenches S1 are arranged next to each other in the X-direction. Each gate trench S1_*n* of the first set has a length of approximately ¼ of the dimension of side 12C.

The two gate fingers 308A1 and 308A2 of the inner gate interconnection portion 308 extend in the same direction (X-direction) as the gate fingers 306A1 and 306A2 of the peripheral gate interconnection portion 306. When the peripheral region 54 and the inner region 56 both include gate fingers extending in the same direction (X-direction), plural second sets of the gate trenches S2 can be arranged next to each other in the Y-direction. This allows the length of the gate trench S2_*n* to be reduced. In the example of FIG. 6, two second sets of the gate trenches S2 are arranged next to each other in the Y-direction. The semiconductor device 300 differs from the semiconductor device 10 shown in FIG. 1 in that the inner gate interconnection portion 308 includes two gate fingers 308A1 and 308A2 extending in the X-direction. This allows for the arrangement of six second sets of the gate trenches S2. Each gate trench S2_*n* of the second set has a length of approximately ⅙ of the dimension of side 12D.

The source interconnection 304 includes the peripheral source interconnection portion 312, located in the peripheral region 54, and the inner source interconnection portion 314, located in the inner region 56.

In the example of FIG. 6, the peripheral source interconnection portion 312 extends continuously in the peripheral region 54, except for the part where the gate pad 310 is formed, and surrounds the inner region 56 in plan view. The peripheral source interconnection portion 312 is connected to the inner source interconnection portion 314 at the region between the gate finger 306A1 and the gate finger 306B2 in plan view. Thus, the potential at the peripheral source interconnection portion 312 is the same as the potential at the inner source interconnection portion 314.

The inner source interconnection portion 314 may be separated from both of the peripheral gate interconnection portion 306 and the inner gate interconnection portion 308 by a predetermined distance that is set taking the breakdown voltage into account. In the example of FIG. 6, the inner source interconnection portion 314 is separated by a fixed distance from the periphery of the gate finger 308B and the periphery of the gate finger 308A1 and 308A2, which intersect the gate finger 308B, so as to have a slit shape accordingly in plan view.

The plural sets of the gate trenches S1 and S2 at least partially overlap both of the gate interconnection 302 and the source interconnection 304 in plan view. Each set of gate trenches is arranged to intersect one gate finger in plan view where the gate electrode 20 embedded in each gate trench is connected to the gate interconnection 302.

The gate trench S1_*n* in each first set extends in the X-direction in plan view and intersects one of the gate fingers 306B1, 306B2, and 308B, which extend in the Y-direction in plan view. In the same manner, the gate trench S2_*n*, which extends in the Y-direction in plan view, in each second set intersects one of the gate fingers 306A1, 306A2, 308A1, and 308A2, which extend in the X-direction in plan view.

In one example, the gate electrode 20 embedded in each gate trench S1_*n* of the first set intersecting the gate finger 308B is electrically connected to the gate finger 308B in the region where the gate trench S1_*n* of the first set intersects the gate finger 308B.

In the same manner, the gate electrode 20 embedded in each gate trench S2_*n* of the second set intersecting the gate finger 306A1 is electrically connected to the gate finger 306A1 in the region where the gate trench S2_*n* of the second set intersects the gate finger 306A1 in plan view.

Each gate trench S1_*n* of the first set intersecting the gate finger 306B1 or 306B2 of the peripheral gate interconnection portion 306 extends across the inner region 56 and the peripheral region 54. Each gate trench S1_*n* of the first set intersecting the gate finger 308B of the inner gate interconnection portion 308 is entirely located in the inner region 56.

In the same manner, each gate trench S2_*n* of the second set intersecting the gate finger 306A1 or 306A2 of the peripheral gate interconnection portion 306 extends across the inner region 56 and the peripheral region 54. Each gate trench S2_*n* of the second set intersecting the gate finger 308A1 or 308A2 of the inner gate interconnection portion 308 is entirely located in the inner region 56.

In the example of FIG. 6, each first set of the gate trenches S1 includes four gate trenches S1_1 to S1_4 that are arranged parallel to each other at equal intervals, and each second set of the gate trenches S2 includes four gate trenches S2_1 to S2_4 that are arranged parallel to each other at equal intervals. The plural sets of the gate trenches S1 and S2 include six first sets of the gate trenches S1 and six second sets of the gate trenches S2.

In the example of FIG. 6, the layout of the gate interconnection 302 and the source interconnection 304 allows each gate trench S1_*n* of the first set to have a length of ⅓ or less of the dimension of side 12C. In the same manner, each gate trench S2_*n* of the second set may have a length of ¼ or less of the dimension of side 12D.

The connection relationship of the field plate electrode 18 and the source interconnection 304 (peripheral source interconnection portion 312 and inner source interconnection portion 314) may be applied to the connection of the field plate electrode 18 and the source interconnection 50.

Fourth Modified Example

Figure 7:
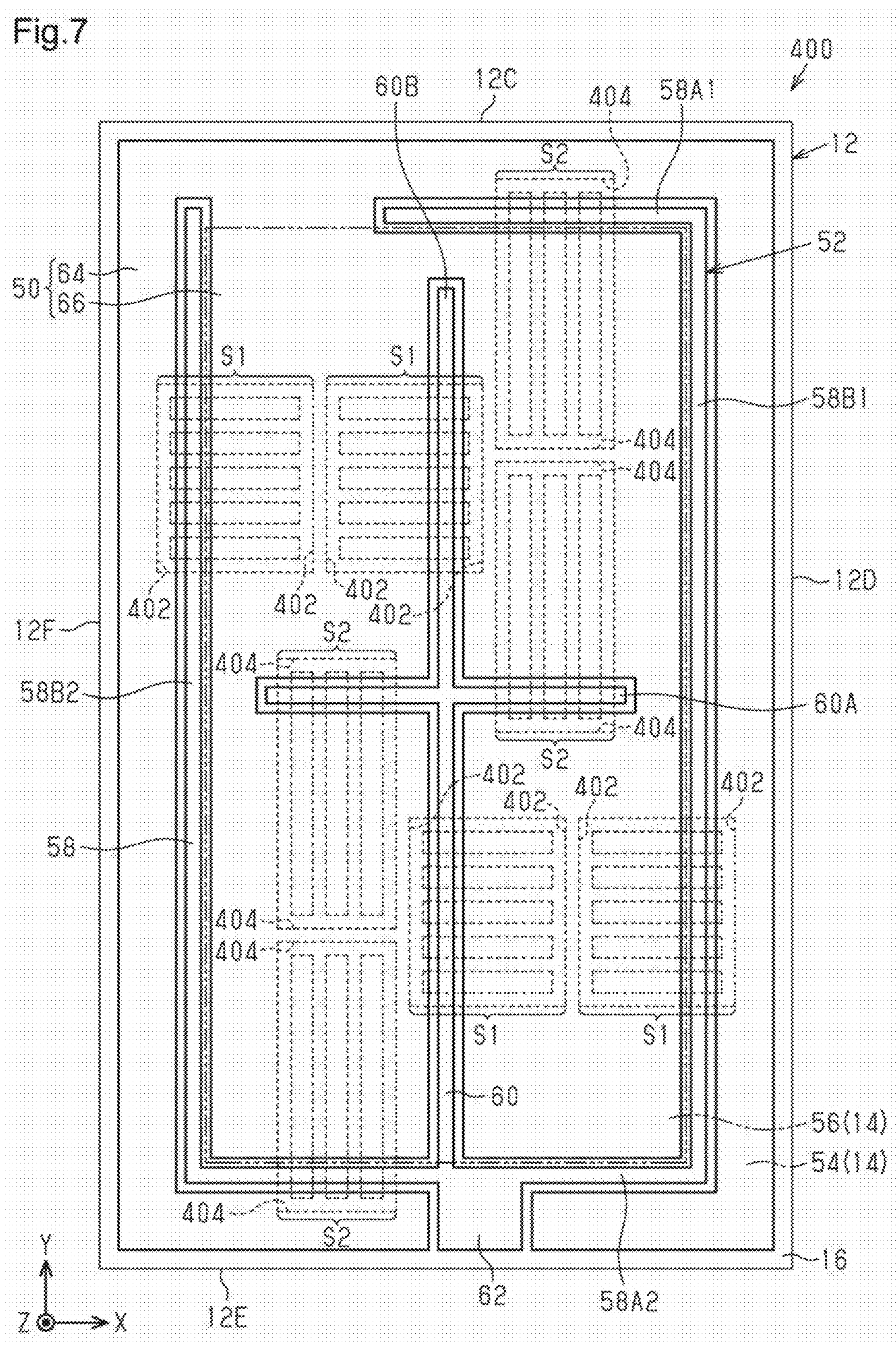
FIG. 7 is a schematic plan view exemplifying a fourth modified example of the semiconductor device.

FIG. 7 is a schematic plan view exemplifying a semiconductor device 400 in accordance with a fourth modified example of the above embodiment. In FIG. 7, same reference characters are given to those elements that are the same as the corresponding elements in the semiconductor device 10 of FIG. 1. Components that are the same as the corresponding components of the semiconductor device 10 will not be described in detail.

In addition to elements similar to those of the semiconductor device 10, the semiconductor device 400 includes a pair of linking trenches 402, linking the gate trenches S1 of each first set to one another and extending in the Y-direction in plan view, and a pair of second linking trenches 404, linking the gate trenches S2 of each second set to one another and extending in the X-direction in plan view.

The field plate electrodes 18 embedded in the gate trenches S1 of each first set are connected to one another in the pair of first linking trenches 402. The field plate electrodes 18 embedded in the gate trenches S2 of each second set are connected to one another in the pair of first linking trenches 404. The two ends 18A and 18B of each field plate electrode 18 (refer to FIG. 3) are connected to the other field plate electrodes 18.

In the semiconductor device 10 shown in FIG. 1, the field plate electrodes 18 are electrically connected to one another by the source interconnection 50. In the semiconductor device 400 of the fourth modified example, the field plate electrodes 18 are directly connected to one another by the pair of linking trenches 402 or the pair of second linking trenches 404. This increases the breakdown voltage of the semiconductor device 400.

Other Modified Examples

The above-described embodiments and modified examples may be modified as described below.

The inner gate interconnection portion may include three or more gate fingers extending in the X-direction.

Each of the plural sets of gate trenches may include only one gate trench instead of the gate trenches that are arranged parallel to one another at equal intervals.

In the first modified example shown in FIG. 4, the gate finger 108B may have a length that is greater than ½ of the dimension of side 12D. This reduces the length of the gate trench S2_*n* in each second set (e.g., to about the same as the gate trench S1_*n* in each first set), and allows the gate trenches S1 in each first set to be increased in number.

In the second modified example shown in FIG. 5, the gate finger 208B may have a length that is greater than ½ of the dimension of side 12D. This reduces the length of the gate trench S2_*n* in each second set (e.g., to about the same as the gate trench S1_*n* in each first set), and allows the gate trenches S1 in each first set to be increased in number.

The conductive type of each region in the semiconductor layer 14 may be reversed. That is, a p-type region may be changed to an n-type region, and an n-type region may be changed to a p-type region.

A further interconnection structure may be formed on the source interconnection and the gate interconnection.

In this specification, the word "on" includes the meaning of "above" in addition to the meaning of "on" unless otherwise described in the context. Accordingly, the phrase of "first layer formed on second layer" may mean that the first layer is formed directly contacting the second layer in one embodiment and that the first layer is arranged above the second layer without contacting the second layer in another embodiment. Thus, the word "on" will also allow for a structure in which another layer is formed between the first layer and the second layer.

The Z-direction referred to in this specification does not necessarily have to be the vertical direction and does not necessarily have to exactly coincide with the vertical direction. Accordingly, in the structures disclosed above (e.g., structures shown in FIGS. 1 and 3), upward and downward in the Z-direction as referred to in this specification is not limited to upward and downward in the vertical direction. For example, the X-direction may be the vertical direction. Alternatively, the Y-direction may be the vertical direction.

Clauses

Technical concepts that can be understood from each of the above embodiments and modified examples will now be described. Reference characters shown in parenthesis in the clauses described below denote corresponding elements of the embodiments described above. The reference characters are given as examples to aid understanding and not intended to limit elements to the elements denoted by the reference characters.

[Clause 1]

A semiconductor device, including:

a semiconductor substrate (12);

a semiconductor layer (14) formed on the semiconductor substrate (12) and including a peripheral region (54) and an active region (56) surrounded by the peripheral region (54) in plan view;

plural sets of gate trenches (S1, S2) formed in the semiconductor layer (14), the plural sets of gate trenches (S1, S2) including a first set (S1) and a second set (S2);

gate electrodes (20), each embedded in a corresponding one of the gate trenches in the plural sets of gate trenches (S1, S2);

field plate electrodes (18), each embedded in a corresponding one of the gate trenches in the plural sets of gate trenches (S1, S2) in a state insulated from the gate electrode (20);

an insulation layer (16) formed on the semiconductor layer (14);

a gate interconnection (52; 102; 202; 302) formed on the insulation layer (16) and connected to the gate electrodes (20), the gate interconnection (52; 102; 202; 302) including a peripheral gate interconnection portion (58; 106; 206; 306), located in the peripheral region (54) in plan view, and an inner gate interconnection portion (60; 108; 208; 308), located in the active region (56) in plan view; and a source interconnection (50; 104; 204; 304) formed on the insulation layer (16) and separated from the gate interconnection (52; 102; 202; 302), where:

each of the field plate electrodes (18) includes two ends (18A, 18B) connected to the source interconnection (50; 104; 204; 304);

the peripheral gate interconnection portion (58; 106; 206; 306) includes a first gate finger (58A1 or 58A2; 106A1; 206A1 or 206A3; 306A1 or 306A2) extending in a first direction in plan view, and the inner gate interconnection portion (60; 108; 208; 308) includes a second gate finger (60B; 108B; 208B; 308B) extending in a second direction orthogonal to the first direction in plan view;

each gate trench (S1_*n*) of the first set extends in the first direction in plan view and intersects the second gate finger (60B; 108B; 208B; 308B); and each gate trench (S2_*n*) of the second set extends in the second direction in plan view and intersects the first gate finger (58A1 or 58A2; 106A1; 206A1 or 206A3; 306A1 or 306A2).

[Clause 2]

The semiconductor device according to clause 1, where each gate trench (S1_*n*) of the first set intersects the second gate finger (60B; 108B; 208B; 308B) between the two ends (18A, 18B) of the field plate electrode (18) embedded in the gate trench in plan view; and each gate trench (S2_*n*) of the second set intersects the first gate finger (58A1 or 58A2; 106A1; 206A1 or 206A3; 306A1 or 306A2) between the two ends (18A, 18B) of the field plate electrode (18) embedded in the gate trench in plan view.

[Clause 3]

The semiconductor device according to clause 1 or 2, where the source interconnection (50; 104; 204; 304) includes:

a peripheral source interconnection portion (64; 112; 212; 312) located in the peripheral region (54); and an inner source interconnection portion (66; 114; 214; 314) located in the active region (56).

[Clause 4]

The semiconductor device according to clause 3, where:

each gate trench (S1_*n*) of the first set is entirely located inside the active region (56);

each gate trench (S2_*n*) of the second set extends across the active region (56) and the peripheral region (54);

the two ends (18A, 18B) of the field plate electrode (18) embedded in each gate trench (S1_*n*) of the first set are both connected to the inner source interconnection portion (66; 114; 214; 314); and one of the two ends (18A, 18B) of the field plate electrode (18) embedded in each gate trench (S2_*n*) of the second set is connected to the inner source interconnection portion (66; 114; 214; 314), and the other one of the two ends (18A, 18B) is connected to the peripheral source interconnection portion (64; 112; 212; 312).

[Clause 5]

The semiconductor device according to any one of clauses 1 to 4, where:

the gate electrode (20) embedded in each gate trench (S1_*n*) of the first set is electrically connected to the second gate finger (60B; 108B; 208B; 308B) in a region where the gate trench (S1_*n*) of the first set intersects the second gate finger (60B; 108B; 208B; 308B) in plan view; and the gate electrode (20) embedded in each gate trench (S2_*n*) of the second set is electrically connected to the first gate finger (58A1 or 58A2; 106A1; 206A1 or 206A3; 306A1 or 306A2) in a region where the gate trench (S2_*n*) of the second set intersects the first gate finger (58A1 or 58A2; 106A1; 206A1 or 206A3; 306A1 or 306A2) in plan view.

[Clause 6]

The semiconductor device according to any one of clauses 1 to 5, where the second gate finger (60B; 108B; 208B; 308B) intersects two or more sets of gate trenches including the gate trenches S1 of the first set.

[Clause 7]

The semiconductor device according to any one of clauses 1 to 6, where the inner gate interconnection portion (60; 308) further includes at least one other gate finger (60A; 308A1; 308A2) intersecting the second gate finger (60B; 308B) in plan view.

[Clause 8]

The semiconductor device according to clause 7, where the at least one other gate finger (60A; 308A1; 308A2) includes a gate finger (60A) extending in the first direction in plan view.

[Clause 9]

The semiconductor device according to clause 7, where the at least one other gate finger (60A; 308A1; 308A2) includes two gate fingers (308A1, 308A2) extending in the first direction in plan view.

[Clause 10]

The semiconductor device according to any one of clauses 1 to 9, where the inner gate interconnection portion (208) further includes a third gate finger (208A) forming a T-shaped junction with the second gate finger (208B) in plan view.

[Clause 11]

The semiconductor device according to any one of clauses 1 to 10, where the peripheral gate interconnection portion (58; 106; 206; 306) further includes a fourth gate finger (58B1 or 58B2; 106B1 or 106B2; 206B1 or 206B2; 306B1 or 306B2) extending in the second direction in plan view.

[Clause 12]

The semiconductor device according to any one of clauses 1 to 11, where the plural sets of gate trenches (S1, S2) each include gate trenches arranged parallel to one another at equal intervals.

[Clause 13]

The semiconductor device according to any one of clauses 1 to 12, further including:

a pair of first linking trenches (402) extending in the second direction in plan view and linking the gate trenches (S1) of the first set to each other; and a pair of second linking trenches (404) extending in the first direction in plan view and linking the gate trenches (S2) of the second set to each other, where:

the field plate electrodes (18) embedded in the gate trenches (S1) of the first set are connected to each other in the pair of first linking trenches (402);

the field plate electrodes (18) embedded in the gate trenches (S2) of the second set are connected to each other in the pair of second linking trenches (404); and the two ends (18A, 18B) of each of the field plate electrodes (18) are connected to another field plate electrode.

[Clause 14]

The semiconductor device according to any one of clauses 1 to 13, where:

the semiconductor substrate (12) includes a surface (12B) on which the semiconductor layer (14) is formed, the surface (12B) including a first side (12C or 12E)

extending in the first direction and a second side (12D or 12F) extending in the second direction;

each gate trench (S1_*n*) of the first set has a length of ½ or less of a dimension of the first side (12C or 12E); and each gate trench (S2_*n*) of the second set has a length of ½ or less of a dimension of the second side (12D or 12F).

[Clause 15]

The semiconductor device according to clause 14, where each gate trench (S1_*n*) of the first set has a length of ⅓ or less of the dimension of the first side (12C or 12E).

[Clause 16]

The semiconductor device according to clause 14 or 15, where each gate trench (S2_*n*) of the second set has a length of ⅓ or less of the dimension of the second side (12D or 12F).

[Clause 17]

The semiconductor device according to any one of clauses 14 to 16, where the dimension of the second side is greater than the dimension of the first side, and each gate trench of the second set has a length that is greater than that of each gate trench of the first set.

[Clause 18]

The semiconductor device according to any one of clauses 1 to 17, where the gate trenches included in the first set are greater in number than the gate trenches included in the second set.

[Clause 19]

The semiconductor device according to any one of clauses 1 to 18, where the active region (56) is a rectangular region, a lateral direction of the active region (56) corresponds to the first direction, and a longitudinal direction of the active region (56) corresponds to the second direction.

[Clause 20]

The semiconductor device according to clause 19, where: the peripheral region (54) has the form of a rectangular frame surrounding the active region (56); and the peripheral gate interconnection portion (58; 106; 206; 306) extends in the peripheral region (54) along a boundary of the active region (56) and the peripheral region (54).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A semiconductor device, comprising:

a semiconductor substrate;

a semiconductor layer formed on the semiconductor substrate and including a peripheral region and an active region surrounded by the peripheral region in plan view;

sets of gate trenches formed in the semiconductor layer, the plural sets of gate trenches including a first set and a second set;

gate electrodes, each embedded in a corresponding one of the gate trenches in the plural sets of gate trenches;

field plate electrodes, each embedded in a corresponding one of the gate trenches of the plural sets of gate trenches in a state insulated from the gate electrode;

an insulation layer formed on the semiconductor layer;

a gate interconnection formed on the insulation layer and connected to the gate electrodes, the gate interconnection including a peripheral gate interconnection portion, located in the peripheral region in plan view, and an inner gate interconnection portion, located in the active region in plan view; and a source interconnection formed on the insulation layer and separated from the gate interconnection, wherein:

each of the field plate electrodes includes two ends connected to the source interconnection;

each of the two ends is connected to the source interconnection via a field plate contact provided at the respective end;

the peripheral gate interconnection portion includes a first gate finger extending in a first direction in plan view, and the inner gate interconnection portion includes a second gate finger extending in a second direction orthogonal to the first direction in plan view;

each gate trench of the first set extends in the first direction in plan view and intersects the second gate finger; and each gate trench of the second set extends in the second direction in plan view and intersects the first gate finger.

2. The semiconductor device according to claim 1, wherein:

each gate trench of the first set intersects the second gate finger between the two ends of the field plate electrode embedded in the gate trench in plan view; and each gate trench of the second set intersects the first gate finger between the two ends of the field plate electrode embedded in the gate trench in plan view.

3. The semiconductor device according to claim 1, wherein the source interconnection includes:

a peripheral source interconnection portion located in the peripheral region; and an inner source interconnection portion located in the active region.

4. The semiconductor device according to claim 3, wherein:

each gate trench of the first set is entirely located inside the active region;

each gate trench of the second set extends across the active region and the peripheral region;

the two ends of the field plate electrode embedded in each gate trench of the first set are both connected to the inner source interconnection portion; and one of the two ends of the field plate electrode embedded in each gate trench of the second set is connected to the inner source interconnection portion, and the other one of the two ends is connected to the peripheral source interconnection portion.

5. The semiconductor device according to claim 1, wherein:

the gate electrode embedded in each gate trench of the first set is electrically connected to the second gate finger in a region where the gate trench of the first set intersects the second gate finger in plan view; and the gate electrode embedded in each gate trench of the second set is electrically connected to the first gate finger in a region where the gate trench of the second set intersects the first gate finger in plan view.

6. The semiconductor device according to claim 1, wherein the second gate finger intersects two or more sets of gate trenches including the gate trenches of the first set.

7. The semiconductor device according to claim 1, wherein the inner gate interconnection portion further includes at least one other gate finger intersecting the second gate finger in plan view.

8. The semiconductor device according to claim 7, wherein the at least one other gate finger includes a gate finger extending in the first direction in plan view.

9. The semiconductor device according to claim 7, wherein the at least one other gate finger includes two gate fingers extending in the first direction in plan view.

10. The semiconductor device according to claim 1, wherein the inner gate interconnection portion further includes a third gate finger forming a T-shaped junction with the second gate finger in plan view.

11. The semiconductor device according to claim 1, wherein the peripheral gate interconnection portion further includes a fourth gate finger extending in the second direction in plan view.

12. The semiconductor device according to claim 1, wherein the plural sets of gate trenches each include gate trenches arranged parallel to one another at equal intervals.

13. The semiconductor device according to claim 1, further comprising:

a pair of first linking trenches extending in the second direction in plan view and linking the gate trenches of the first set to each other; and a pair of second linking trenches extending in the first direction in plan view and linking the gate trenches of the second set to each other, wherein:

each first linking trench is formed in the semiconductor layer and has a sidewall and a bottom wall, and links the gate trenches of the first set to each other through the sidewall of the first linking trench;

each second linking trench is formed in the semiconductor layer and has a sidewall and a bottom wall, and links the gate trenches of the second set to each other through the sidewall of the second linking trench; and the field plate electrodes embedded in the gate trenches of the first set are connected to each other in the pair of first linking trenches; the field plate electrodes embedded in the gate trenches of the second set are connected to each other in the pair of second linking trenches; and the two ends of each of the field plate electrodes are connected to another field plate electrode.

14. The semiconductor device according to claim 1, wherein:

the semiconductor substrate includes a surface on which the semiconductor layer is formed, the surface including a first side extending in the first direction and a second side extending in the second direction;

each gate trench of the first set has a length of ½ or less of a dimension of the first side; and each gate trench of the second set has a length of ½ or less of a dimension of the second side.

15. The semiconductor device according to claim 14, wherein each gate trench of the first set has a length of ⅓ or less of the dimension of the first side.

* * * * *